(12) United States Patent
Hirose et al.

(10) Patent No.: US 9,583,914 B2
(45) Date of Patent: Feb. 28, 2017

(54) SEMICONDUCTOR LASER ELEMENT

(71) Applicants: Kyoto University, Kyoto-shi, Kyoto (JP); HAMAMATSU PHOTONICS K.K., Hamamatsu-shi, Shizuoka (JP)

(72) Inventors: Kazuyoshi Hirose, Hamamatsu (JP); Akiyoshi Watanabe, Hamamatsu (JP); Yoshitaka Kurosaka, Hamamatsu (JP); Takahiro Sugiyama, Hamamatsu (JP); Susumu Noda, Kyoto (JP)

(73) Assignees: Kyoto University, Kyoto-shi, Kyoto (JP); HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/771,911

(22) PCT Filed: Feb. 27, 2014

(86) PCT No.: PCT/JP2014/054916
§ 371 (c)(1),
(2) Date: Sep. 1, 2015

(87) PCT Pub. No.: WO2014/136653
PCT Pub. Date: Sep. 12, 2014

(65) Prior Publication Data
US 2016/0020581 A1 Jan. 21, 2016

(30) Foreign Application Priority Data

Mar. 4, 2013 (JP) ................................. 2013-041973
Sep. 27, 2013 (JP) ................................. 2013-202086

(51) Int. Cl.
*H01S 5/00* (2006.01)
*H01S 5/18* (2006.01)
(Continued)

(52) U.S. Cl.
CPC ............ *H01S 5/18* (2013.01); *H01S 3/08009* (2013.01); *H01S 5/0425* (2013.01); *H01S 5/105* (2013.01);
(Continued)

(58) Field of Classification Search
CPC .. H01S 5/105; H01S 5/18319; H01S 3/08009; H01S 5/183; H01S 5/12;
(Continued)

(56) References Cited

U.S. PATENT DOCUMENTS

2007/0217466 A1* 9/2007 Noda ........................ H01S 5/18
372/50.11
2011/0044365 A1 2/2011 Chen et al.

FOREIGN PATENT DOCUMENTS

JP 2004-296538 A 10/2004
JP 2007-258261 A 10/2007
(Continued)

OTHER PUBLICATIONS

Y. Kurosaka et al., "Controlling vertical optical confinement in two-dimensional surface-emitting photonic-crystal lasers by shape of air holes," Optics Express, vol. 16, No. 22, Oct. 27, 2008, pp. 18485-18494.
(Continued)

*Primary Examiner* — Yuanda Zhang
(74) *Attorney, Agent, or Firm* — Drinker Biddle & Reath LLP

(57) ABSTRACT

A semiconductor laser element is realized with high beam quality (index $M^2<1$). A diffraction grating $6ba$ of a diffraction grating layer 6 extends along a principal surface $2a$ and is provided on a p-side surface $6a$ of the diffraction grating layer 6; the refractive index of the diffraction grating layer 6 periodically varies in directions extending along the principal surface $2a$, in the diffraction grating $6ba$; the diffrac-
(Continued)

tion grating 6*ba* has a plurality of holes 6*b*; the plurality of holes 6*b* are provided in the p-side surface 6*a* and arranged in translational symmetry along a square lattice R3; the plurality of holes 6*b* each have the same size and shape; each hole 6*b* corresponds to a lattice point of the diffraction grating 6*ba* and is of a triangular prism shape; a shape of a bottom face 6*c* of the hole 6*b* is an approximate right triangle.

5 Claims, 41 Drawing Sheets

(51) Int. Cl.
*H01S 3/08* (2006.01)
*H01S 5/183* (2006.01)
*H01S 5/042* (2006.01)
*H01S 5/10* (2006.01)
*H01S 5/12* (2006.01)

(52) U.S. Cl.
CPC .............. *H01S 5/12* (2013.01); *H01S 5/1231* (2013.01); *H01S 5/183* (2013.01); *H01S 5/18319* (2013.01); *H01S 2301/14* (2013.01)

(58) Field of Classification Search
CPC ........ H01S 5/0425; H01S 5/18; H01S 5/1231; H01S 2301/14
See application file for complete search history.

(56) References Cited

FOREIGN PATENT DOCUMENTS

| JP | 2012-033748 A | 2/2012 |
|----|---------------|--------|
| WO | WO-2005/086302 A1 | 9/2005 |
| WO | WO-2009/001699 A1 | 12/2008 |
| WO | WO-2012/014604 A1 | 2/2012 |

OTHER PUBLICATIONS

C. Peng et al., "Coupled-wave analysis for photonic-crystal surface-emitting lasers on air holes with arbitrary sidewalls," Optics Express, vol. 19, No. 24, Nov. 21, 2011, pp. 24672-24686.

Y. Liang et al., "Three-dimensional coupled-wave analysis for square-lattice photonic crystal surface emitting lasers with transverse-electric polarization: finite-size effects," Optics Express, vol. 20, No. 14, Jul. 2, 2012, pp. 15945-15961.

Y. Liang et al., "Three-dimensional coupled-wave analysis for triangular-lattice photonic-crystal surface-emitting lasers with transverse-electric polarization," Optics Express, vol. 21, No. 1, Jan. 14, 2013, pp. 565-580.

Y. Liang et al., "Three-dimensional coupled-wave model for square-lattice photonic crystal lasers with transverse electric polarization: A general approach," Physical Review B, vol. 84, 195119, 2011, pp. 195119-1 through 195119-11.

C. Peng et al., "Three-dimensional coupled-wave theory analysis of a centered-rectangular lattice photonic crystal laser with a transverse-electric-like mode," Physical Review B, vol. 86, 035108, 2012, pp. 035108-1 through 035108-11.

* cited by examiner

| ELECTRIC CURRENT (mA) | M² IN x-AXIS DIRECTION | M² IN y-AXIS DIRECTION |
|---|---|---|
| 300 | 1.055 | 0.943 |
| 400 | 0.923 | 0.757 |
| 500 | 0.878 | 0.762 |
| 600 | 0.884 | 0.870 |

Fig.22
(A)
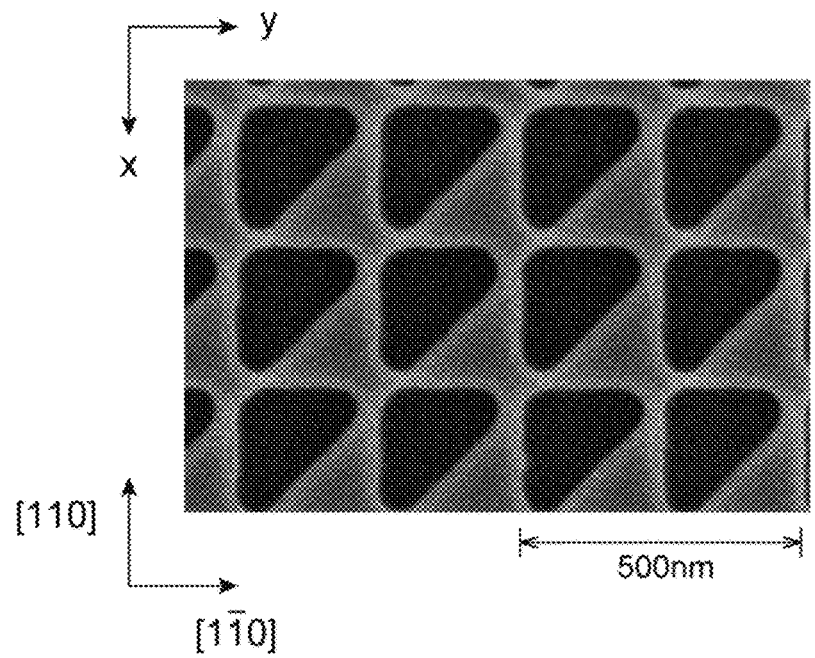
(B)
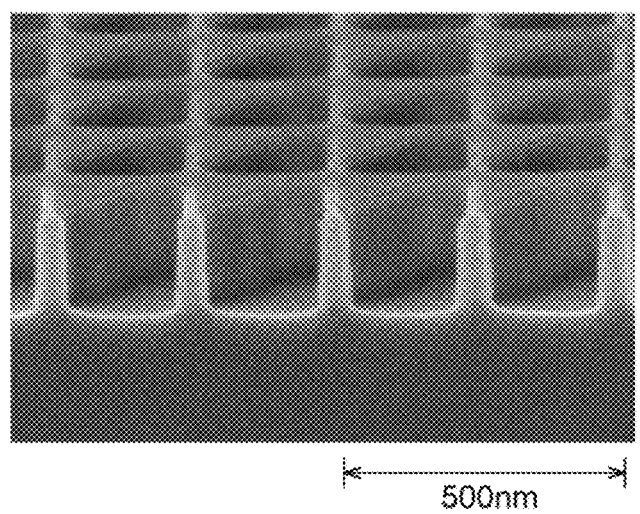

SEMICONDUCTOR LASER ELEMENT

TECHNICAL FIELD

The present invention relates to a semiconductor laser element with a photonic crystal structure.

BACKGROUND ART

Patent Literature 1 discloses a two-dimensional photonic crystal vertical cavity surface emitting laser. Its lattice structure is a square lattice or orthogonal lattice. The lattice structure has translational symmetry. The shape of lattice points is triangular.

Patent Literature 2 discloses a surface emitting laser. The surface emitting laser has a laminated body, a first electrode, and a second electrode. The laminated body has an active layer and a two-dimensional photonic crystal. The laminated body lies between the first electrode and the second electrode. The first electrode has an annular shape. The two-dimensional photonic crystal lases to emit a laser beam. The laser beam has an annular cross-sectional shape and is radially polarized.

CITATION LIST

Patent Literatures

Patent Literature 1: Japanese Patent Application Laid-open Publication No. 2004-296538
Patent Literature 2: Japanese Patent Application Laid-open Publication No. 2007-258261

Non Patent Literatures

Non Patent Literature 1: Y. Liang et al., "Three-dimensional coupled-wave model for square-lattice photonic crystal lasers with transverse electric polarization: A general approach," Phys. Rev. B84, 195119 (2011)
Non Patent Literature 2: Chao Peng et al., "Coupled-wave analysis for photonic-crystal surface-emitting lasers on air holes with arbitrary sidewalls," Optics Express Vol. 19 No. 24, pp. 24672-24686 (2011)
Non Patent Literature 3: Y. Kurosaka et al., "Controlling vertical optical confinement in two-dimensional surface-emitting photonic-crystal lasers by shape of air holes," Opt. Express 16, 18485-18494 (2008)

SUMMARY OF INVENTION

Technical Problem

The semiconductor lasers have been used heretofore in various fields, e.g., communications, processing, measurement, excitation, wavelength conversion, and so on. However, since the conventional semiconductor lasers have the problems of low beam quality and poor concentration characteristics, their usage is limited and thus lasers with good beam quality such as solid-state lasers, gas lasers, and fiber lasers are mainly used in high-precision microfabrication and advanced optical fields. On the other hand, the semiconductor lasers have characteristics of smaller size and higher efficiency than the other lasers. An object of the present invention, in view of the above circumstances, is to realize a semiconductor laser element with high beam quality (index $M^2 < 1$).

Solution to Problem

A semiconductor laser element according to one aspect of the present invention comprises a semiconductor laminate, wherein the semiconductor laminate comprises a support substrate, a first cladding layer, an active layer, a diffraction grating layer, and a second cladding layer, wherein the first cladding layer, the active layer, the diffraction grating layer, and the second cladding layer are provided on a principal surface of the support substrate, wherein the active layer and the diffraction grating layer are provided between the first cladding layer and the second cladding layer, wherein the active layer generates light, wherein the second cladding layer has a conductivity type different from a conductivity type of the first cladding layer, wherein the diffraction grating layer has a diffraction grating, wherein the diffraction grating has a two-dimensional photonic crystal structure of square lattice arrangement, wherein the two-dimensional photonic crystal structure has a plurality of holes and extends along the principal surface, wherein the plurality of holes have an identical shape and are arranged along a square lattice of the diffraction grating, wherein the hole corresponds to a lattice point of the diffraction grating, wherein a shape of a bottom face of the hole is an approximate right triangle, wherein the hole has a refractive index different from a refractive index of a base material of the diffraction grating, wherein a node of an electromagnetic field generated in the diffraction grating by luminescence of the active layer is located substantially at the same position as a centroid of the approximate right triangle of the hole, and wherein an extremum of intensity of a magnetic field in the electromagnetic field is present around the hole. The semiconductor laser element according to the one aspect of the present invention outputs the laser beam through the diffraction grating and this diffraction grating has a plurality of lattice points of the approximate right triangle arranged along the square lattice. In the case of the electromagnetic field mode at the second band edge from the low frequency side near the second Γ point of the square lattice (or in the case of Mode B), the node of the electromagnetic field generated in the diffraction grating by luminescence of the active layer is located substantially at the same position as the centroid of the approximate right triangle of the hole, and the extremum of intensity of the magnetic field in the electromagnetic field on the square lattice is present around the hole. It was discovered by Inventor's intensive and extensive research that the beam quality of index $M^2 < 1$ could be realized in this case of Mode B. Therefore, the laser beam output by the semiconductor laser element according to the one aspect of the present invention has the beam quality of the index $M^2 < 1$.

In the semiconductor laser element according to the one aspect of the present invention, the semiconductor laminate further comprises an electron blocking layer, and the electron blocking layer lies between a layer with a conductivity type of p-type in the first cladding layer and the second cladding layer, and the active layer. The electron blocking layer enables capability for high output.

In the semiconductor laser element according to the one aspect of the present invention, the diffraction grating layer lies between a layer with a conductivity type of p-type in the first cladding layer and the second cladding layer, and the active layer. When the semiconductor laminate is formed from the n-side layer, the diffraction grating layer is formed after formation of the active layer and thus the active layer is prevented from being directly damaged during processing of the diffraction grating layer, whereby degradation of the active layer can be avoided.

In the semiconductor laser element according to the one aspect of the present invention, the bottom face has a first side and a second side, the first side and the second side make a right angle, and the first side is inclined relative to a lattice vector of the square lattice. Since oscillation at the band edge B is possible even with the inclination of the approximate right triangle of the lattice point relative to the lattice vector, the beam quality of the index $M^2$ can be maintained, which was discovered by Inventor's intensive and extensive research. In the steps of manufacturing the semiconductor laser element, when the diffraction grating layer and the laminate subsequent thereto are formed by regrowth in the MOCVD (Metal Organic Chemical Vapor Deposition) process, the quality of the laminate can be optimized by the foregoing inclination, depending upon the shape of the lattice point.

In the semiconductor laser element according to the one aspect of the present invention, a material of the semiconductor laminate is a III-V semiconductor containing GaAs. In this manner, the semiconductor laminate of the semiconductor laser element according to the one aspect of the present invention can be manufactured using the III-V semiconductor containing GaAs. Since the manufacturing technology has been established for such material system, manufacture of the semiconductor laser element becomes relatively easier.

In the semiconductor laser element according to the one aspect of the present invention, each of three vertices of the approximate right triangle of the bottom face is rounded so as to overlap a circumference of a reference circle touching the sides internally at the vertex. It was discovered by Inventor's intensive and extensive research that the beam quality of the index $M^2$ could be maintained even if the three vertices of the approximate right triangle of the lattice point were rounded.

In the semiconductor laser element according to the one aspect of the present invention, the approximate right triangle of the bottom face has a first side and a second side; the first side and the second side make a right angle; each of three vertices of the approximate right triangle of the bottom face is rounded so as to overlap a circumference of a reference circle touching the sides internally at the vertex; the shape of the approximate right triangle of the hole satisfies any one of the following conditions (1) to (10): (1) a roundedness is 0.00×a lattice constant, a filling factor is not less than 10% and not more than 25%, and an aspect ratio is not less than 1.00 and not more than 1.16; (2) a roundedness is 0.00×a lattice constant, a filling factor is not less than 15% and not more than 25%, and an aspect ratio is not less than 1.16 and not more than 1.20; (3) a roundedness is 0.05×a lattice constant, a filling factor is not less than 9% and not more than 24%, and an aspect ratio is not less than 1.00 and not more than 1.20; (4) a roundedness is 0.10×a lattice constant, a filling factor is not less than 10% and not more than 22%, and an aspect ratio is not less than 1.00 and not more than 1.08; (5) a roundedness is 0.10×a lattice constant, a filling factor is not less than 10% and not more than 21%, and an aspect ratio is not less than 1.08 and not more than 1.12; (6) a roundedness is 0.10×a lattice constant, a filling factor is not less than 10% and not more than 18%, and an aspect ratio is not less than 1.12 and not more than 1.20; (7) a roundedness is 0.15×a lattice constant, a filling factor is not less than 11% and not more than 22%, and an aspect ratio is not less than 1.00 and not more than 1.08; (8) a roundedness is 0.15×a lattice constant, a filling factor is not less than 11% and not more than 21%, and an aspect ratio is not less than 1.08 and not more than 1.16; (9) a roundedness is 0.15×a lattice constant, a filling factor is not less than 11% and not more than 20%, and an aspect ratio is not less than 1.16 and not more than 1.20; (10) a roundedness is 0.20×a lattice constant, a filling factor is not less than 13% and not more than 22%, and an aspect ratio is not less than 1.00 and not more than 1.20; where the roundedness is a radius of the reference circle, the lattice constant is a length of one side of a unit lattice of the diffraction grating, the filling factor is a rate of an area of the approximate right triangle of the hole to an area of the unit lattice, and the aspect ratio is a ratio of a side length of the first side and a side length of the second side on the assumption that the vertices are not rounded. When the shape of the approximate right triangle of the bottom face of the hole satisfies any one of the foregoing conditions (1) to (10), the oscillation in Mode B becomes particularly prominent, which was discovered by the Inventor.

Advantageous Effect of Invention

According to one aspect of the present invention, the semiconductor laser element can be realized with high beam quality (index $M^2<1$).

BRIEF DESCRIPTION OF DRAWINGS

FIG. 12 is a drawing for explaining the configuration of the lattice point of the square lattice according to the embodiment.

FIG. 17 is a drawing for explaining the beam quality of the semiconductor laser element according to the embodiment.

FIG. 22 is SEM images of an example of the semiconductor laser element according to the embodiment.

DESCRIPTION OF EMBODIMENTS

Figure 1:
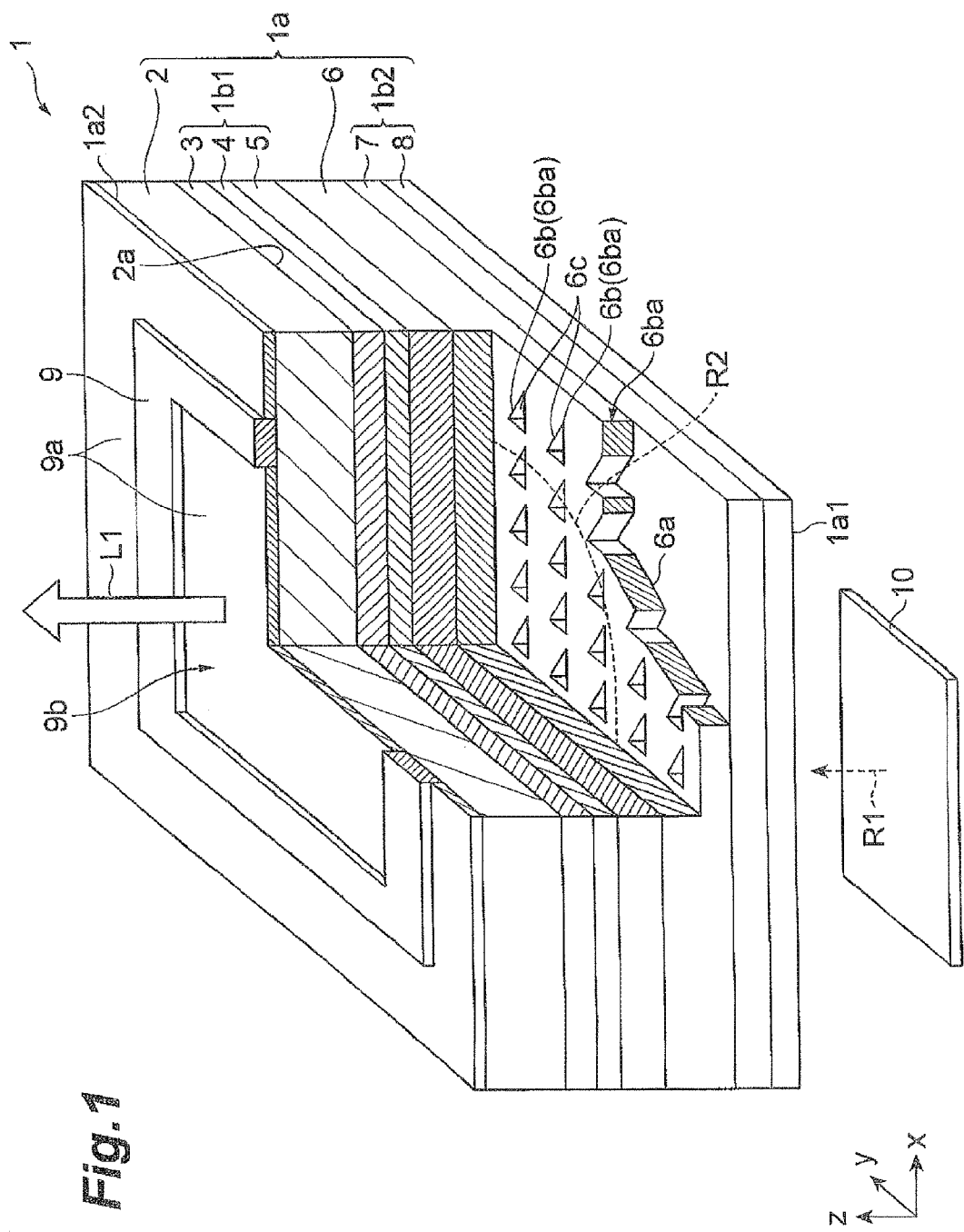
FIG. 1 is a drawing for explaining a configuration of a semiconductor laser element according to an embodiment.

Embodiments of the present invention will be described below in detail with reference to the drawings. In the description of the drawings the same elements will be denoted by the same reference signs as much as possible, without redundant description. Referring to FIG. 1, the configuration of the semiconductor laser element 1 according to an embodiment will be described. An orthogonal coordinate system composed of x-axis, y-axis, and z-axis is shown in FIG. 1. The arrangement of the x-axis, y-axis, z-axis, and the semiconductor laser element (particularly, diffraction grating 6ba and holes 6b) shall be the same in FIGS. 1-6, 15-20, and 22. The semiconductor laser element 1 is a regrowth type PCSEL (Photonic Crystal Surface Emitting Laser).

The semiconductor laser element 1 has a semiconductor laminate 1a, an AR coat 9a (Anti Reflective: non-reflective), an n-side electrode 9, and a p-side electrode 10. Materials of the semiconductor laminate 1a are, for example, III-V semiconductors containing GaAs. The semiconductor laminate 1a has a support substrate 2, a laminate 1b1, a diffraction grating layer 6, and a laminate 1b2. The laminate 1b1 has an n-type cladding layer 3, an active layer 4, and an electron blocking layer 5. The laminate 1b2 has a p-type cladding layer 7 and a contact layer 8. The laminate 1b1 is provided on a principal surface 2a of the support substrate 2. The laminate 1b2 is provided on the diffraction grating layer 6. The diffraction grating layer 6 is provided between the laminate 1b1 and the laminate 1b2. The n-side electrode 9 is provided on a back surface 1a2 of the semiconductor laminate 1a. The back surface 1a2 lies on the opposite side to a front surface 1a1, is a face on the opposite side to the principal surface 2a, and corresponds to a back surface of the support substrate 2. The n-side electrode 9 is in contact with the back surface 1a2. The n-side electrode 9 has such a shape as to surround an opening 9b. The n-side electrode 9 defines the opening 9b. The opening 9b includes a central region of the back surface 1a2. The AR coat 9a is provided on the back surface 1a2. The AR coat 9a, when viewed on a plan view, is provided on regions except for the n-side electrode 9 in the back surface 1a2. The AR coat 9a is in contact with the back surface 1a2. The p-side electrode 10 is provided on the front surface 1a1 of the semiconductor laminate 1a (front surface of the contact layer 8) lying on the side indicated by a direction R1. When a voltage is applied between the n-side electrode 9 and the p-side electrode 10 to allow an electric current to flow through the semiconductor laminate 1a, a laser beam L1 is output in the z-axis direction.

The n-type cladding layer 3, active layer 4, electron blocking layer 5, diffraction grating layer 6, p-type cladding layer 7, and contact layer 8 are stacked in order in the opposite direction to the z-axis direction (or in a direction of a normal vector to the principal surface 2a) from the principal surface 2a by epitaxial growth. The n-type cladding layer 3, active layer 4, diffraction grating layer 6, and p-type cladding layer 7 are provided on the principal surface 2a. The active layer 4 and the diffraction grating layer 6 are provided between the n-type cladding layer 3 and the p-type cladding layer 7. The support substrate 2, n-type cladding layer 3, active layer 4, electron blocking layer 5, diffraction grating layer 6, p-type cladding layer 7, and contact layer 8 extend along the xy plane. The back surface 1a2, principal surface 2a, p-side surface 6a of the diffraction grating layer 6, and front surface 1a1 (the front surface of the contact layer 8) extend along the xy plane.

The diffraction grating layer 6 has a diffraction grating 6ba. The diffraction grating 6ba has a two-dimensional photonic crystal structure of square lattice arrangement. The two-dimensional photonic crystal structure of the diffraction grating 6ba extends along the principal surface 2a. The two-dimensional photonic crystal structure of the diffraction grating 6ba is a crystal structure in two dimensions (xy plane). The diffraction grating 6ba is provided on the p-side surface 6a of the diffraction grating layer 6. The refractive index of the diffraction grating layer 6 periodically varies in directions extending along the principal surface 2a (the x-axis direction and y-axis direction), in the diffraction grating 6ba. The two-dimensional photonic crystal structure of the diffraction grating 6ba has a plurality of holes 6b. The plurality of holes 6b have an identical shape (approximate triangular prism shape). The plurality of holes 6b are periodically arranged in the directions extending along the principal surface 2a (the x-axis direction and y-axis direction), in a base material of the diffraction grating 6ba. Namely, the plurality of holes 6b are arranged along the square lattice of the diffraction grating 6ba. Each hole 6b corresponds to a lattice point of the diffraction grating 6ba. The holes 6b have the refractive index different from that of the base material of the diffraction grating 6ba. The plurality of holes 6b cause the refractive index of the diffraction grating 6ba to periodically vary in the directions extending along the principal surface 2a (the x-axis direction and y-axis direction), for light of the same wavelength. The holes 6b are of the approximate triangular prism shape. This approximate triangular prism shape extends from a bottom face 6c of the hole 6b in the p-side surface 6a toward the p-side. The shape of the bottom face 6c of the hole 6b and the shape of the opening of the hole 6b (the opening of the hole 6b in the p-side surface 6a) have the same shape and the both are an approximate right triangle. It is noted herein that the shape allows of deformation made in a manufacturing process.

A material of the support substrate 2 is, for example, n-type GaAs. A material of the n-type cladding layer 3 is, for example, n-type AlGaAs. The thickness of the n-type cladding layer 3 is, for example, about 2000 nm. For example, when the oscillation wavelength is assumed to be 980 nm, the refractive index of the n-type cladding layer 3 is about 3.11.

The active layer 4 generates light. The active layer 4 has, for example, three quantum well layers. A material of the quantum well layers of the active layer 4 is, for example, i-type InGaAs. A material of barrier layers of the active layer 4 is, for example, i-type AlGaAs. The active layer 4 can have a guide layer in contact with the n-type cladding layer 3. A material of this guide layer of the active layer 4 is, for example, i-type AlGaAs. The thickness of the active layer 4 is, for example, about 140 nm. The refractive index of the active layer 4 is about 3.49, for example, when it is assumed that the oscillation wavelength is equal to 980 nm.

The electron blocking layer 5 lies between the p-type cladding layer 7 with the conductivity type of p-type and the active layer 4. A material of the electron blocking layer 5 is, for example, i-type AlGaAs. The electron blocking layer 5 can have a guide layer in contact with the diffraction grating layer 6. A material of this guide layer of the electron blocking layer 5 is, for example, i-type AlGaAs. The thickness of the electron blocking layer 5 is, for example, about 35 nm. The refractive index of the electron blocking layer 5 is about 3.33, for example, when it is assumed that the oscillation wavelength is equal to 980 nm.

The diffraction grating layer 6 lies between the p-type cladding layer 7 with the conductivity type of p-type and the active layer 4. The diffraction grating layer 6 has the diffraction grating 6ba of the two-dimensional photonic crystal structure. The diffraction grating layer 6 further has a guide layer in contact with the electron blocking layer 5. The thickness of the diffraction grating layer 6 is, for example, about 300 nm. A material of the guide layer of the diffraction grating layer 6 is, for example, i-type GaAs. The base material of the diffraction grating layer 6ba is, for example, i-type GaAs, i-type AlGaAs, or the like. The diffraction grating 6ba has the plurality of holes 6b (hollow spaces). The plurality of holes 6b are periodically provided in the x-axis direction and y-axis direction, in the base material of the diffraction grating 6ba. Because of the plurality of holes 6b, the refractive index of the diffraction grating 6ba periodically varies in the directions extending along the principal surface 2a (or in the x-axis direction and y-axis direction), for light of the same wavelength. The refractive index of the diffraction grating 6ba can be estimated, for example, as follows: the oscillation wavelength is assumed to be 980 nm, the holes 6b are assumed to be hollow spaces with the refractive index=1, and dielectric constants of respective portions (squares of refractive indices herein) are averaged depending upon the area of the holes 6b to the surface of the diffraction grating 6ba (the surface extending along the xy plane), to obtain a value of dielectric constant to define the refractive index. The depth of the holes 6b is, for example, 200 nm. If the thickness of the diffraction grating layer 6 is about 300 nm and the depth of the holes 6b is 300 nm, the diffraction grating layer 6 has no guide layer. The laser beam L1 is emitted mainly from a luminous region R2.

A material of the p-type cladding layer 7 is, for example, p-type AlGaAs. The thickness of the p-type cladding layer 7 is, for example, about 2000 nm. The refractive index of the p-type cladding layer 7 is about 3.27, for example, when the oscillation wavelength is assumed to be 980 nm. The conductivity type of the p-type cladding layer 7 and the conductivity type of the n-type cladding layer 3 are different from each other.

A material of the contact layer 8 is, for example, p-type GaAs. The thickness of the contact layer 8 is, for example, about 200 nm. The refractive index of the contact layer 8 is about 3.52, for example, when the oscillation wavelength is assumed to be 980 nm.

A material of the n-side electrode 9 to be used herein can be a material for electrodes provided on semiconductor layers of GaAs-based materials. The material of the n-side electrode 9, can be, for example, a mixture of a metal such as Au with a semiconductor such as Ge. The n-side electrode can be, for example, AuGe, AuGe/Au, or the like.

A material of the p-side electrode 10 to be used herein can be a material for the electrodes provided on the semiconductor layers of GaAs-based materials. The material of the p-side electrode 10 can be, for example, a metal such as Au, Ti, Pt, or Cr. The p-side electrode 10 can be, for example, Ti/Pt/Au, Ti/Au, Cr/Au, or the like, in order from the GaAs semiconductor layer side. The contact layer 8 in contact with the p-side electrode 10 is doped with an impurity in a high concentration of not less than $1 \times 10^{19}/cm^{-3}$. The shape of the surface of the p-side electrode 10 is, for example, square and the area of the shape of this surface of the p-side electrode 10 is 200×200 μm².

Figure 2:
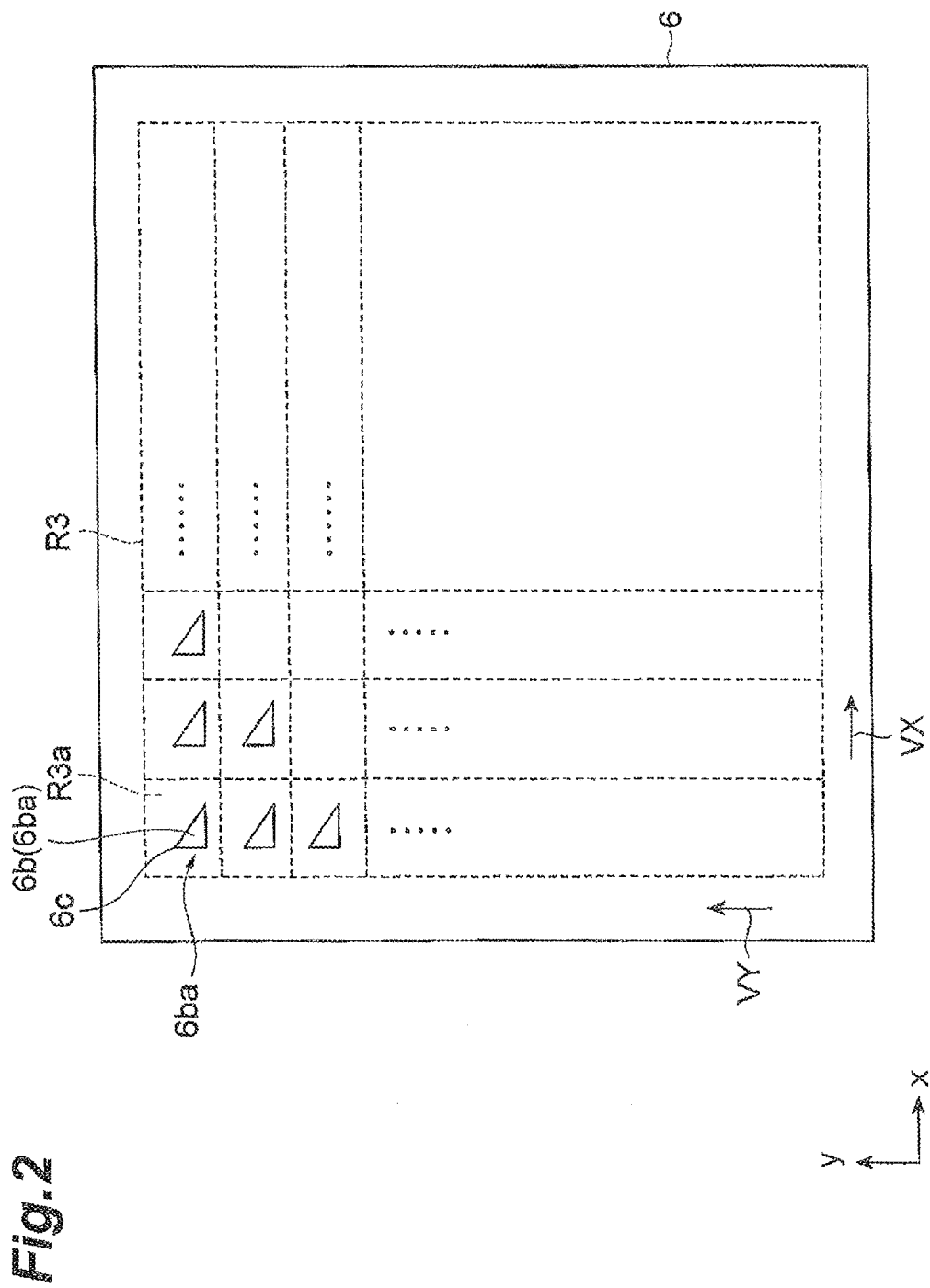
FIG. 2 is a drawing for explaining a configuration of a square lattice according to the embodiment.
Figure 3:
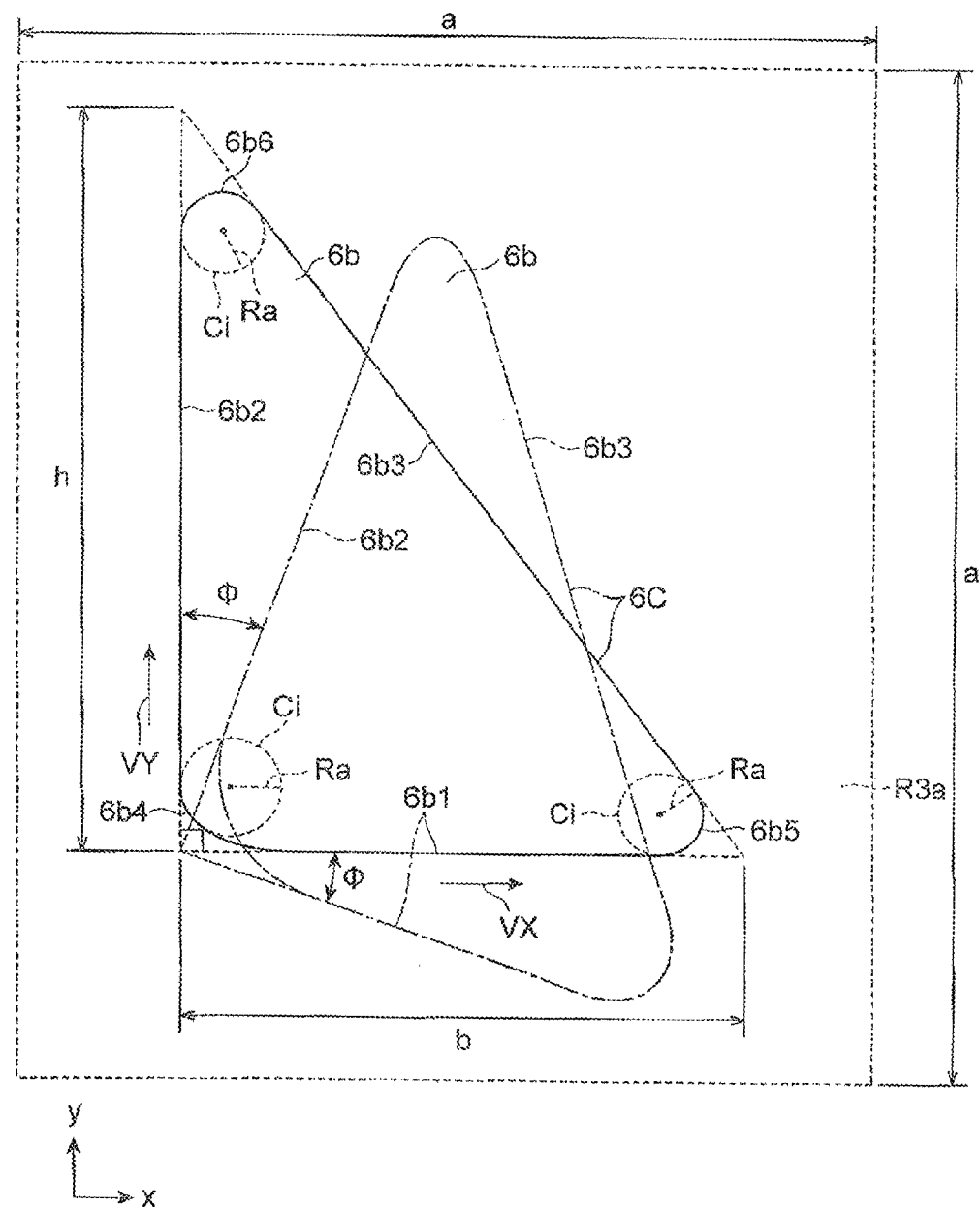
FIG. 3 is a drawing for explaining a configuration of a lattice point of the square lattice according to the embodiment.

The configuration of the diffraction grating 6ba will be described with reference to FIG. 2. FIG. 2 is a drawing of the diffraction grating 6ba viewed from the side where the principal surface 2a lies. The shape of the holes 6b shown in FIG. 2 is the shape of the bottom faces 6c of the holes 6b (cross sections of the holes 6b in the xy plane) and is the same as the shape of the openings of the holes 6b in the p-side surface 6a. The plurality of holes 6b are provided in the p-side surface 6a. The plurality of holes 6b each have the same shape. The hole 6b corresponds to a lattice point of the diffraction grating 6ba. The shape of the bottom face 6c of the hole 6b (which is a cross section of the hole 6b in the xy plane, or the opening of the hole 6b in the p-side surface 6a) is an approximate right triangle as shown in FIG. 3. The plurality of holes 6b are arranged in translational symmetry along a virtual square lattice R3. The square lattice R3 consists of a plurality of virtual unit lattices R3a. The square lattice R3 is defined by lattice vector VX and lattice vector VY. The plurality of unit lattices R3a are continuously arranged in a direction defined by the lattice vector VX and in a direction defined by the lattice vector VY. The direction of the lattice vector VX is identical with the x-axis direction. The direction of the lattice vector VY is identical with the y-axis direction.

The configuration of the lattice point (hole 6b) of the diffraction grating layer 6 will be described with reference to FIG. 3. One unit lattice R3a has one hole 6b. The unit lattice R3a is square. The lattice constant of the square lattice R3 (length of one side of the unit lattice R3a), when a value of the lattice constant is a, is, for example, a=approximately 290 nm. The shape of the hole 6b shown in FIG. 3 is the shape of the bottom face 6c of the hole 6b and is the same as the shape of the opening of the hole 6b in the p-side surface 6a. The bottom face 6c of the hole 6b has a first side 6b1, a second side 6b2, and a third side 6b3. The third side 6b3 corresponds to the hypotenuse of the approximate right triangle of the bottom face 6c of the hole 6b. The first side 6b1 and the second side 6b2 make a right angle.

An angle Φ between the first side 6b1 and the lattice vector VX (angle Φ between the second side 6b2 and the lattice vector VY) is approximately 0° in the present embodiment. The angle Φ can be any angle. In viewing the xy plane including the hole 6b from the z-axis direction, when the downward view from the +z-direction is compared with the upward view from the −z-direction, the viewed shapes of the hole 6b look mirror-inverted from each other, in any direction on the xy plane, but they are the same structure. For this reason, the same effect is achieved with approximate right triangle shapes obtained by mirror inversion of the approximate right triangle of the hole 6b in the xy plane with respect to the x-axis direction or the y-axis direction or the both directions or the like. When the angle Φ is larger than 0°, the first side 6b1 is inclined relative to the lattice vector VX and the second side 6b2 is inclined relative to the lattice vector VY.

Each of the vertex 6b4, vertex 6b5, and vertex 6b6 of the approximate right triangle of the bottom face 6c of the hole 6b is rounded so as to overlap the circumference of a reference circle Ci. The reference circle Ci touches the sides internally at each of the vertex 6b4, vertex 6b5, and vertex 6b6. Roundedness K1 of the vertex 6b4, vertex 6b5, and vertex 6b6 is represented by a reference radius Ra of the reference circle Ci. When the value of the lattice constant a is represented by a, K1 is equal to k×a (where a is the lattice constant). In the present embodiment K1 is approximately 0.10×a. K1 can be in the range of not less than 0.00×a and not more than 0.25×a.

When the shape of the bottom face 6c of the hole 6b is assumed to be a right triangle without roundedness of the vertices, the length of a side including the first side 6b1 is defined as side length b and the length of a side including the second side 6b2 as side length h. A value K2 obtained by dividing the side length h by the side length b (aspect ratio) is K2=h/b, where h is a value of the side length h and b is a value of the side length b. In the present embodiment K2 is 1.0. K2 can be not less than 1.0 and not more than 2.0.

A filling factor K3 of the bottom face 6c of the hole 6b is a rate (%) of the area of the bottom face 6c of the hole 6b to the area of the unit lattice R3a. In the present embodiment K3 is 10%. K3 can be not more than 35%.

Figure 4:
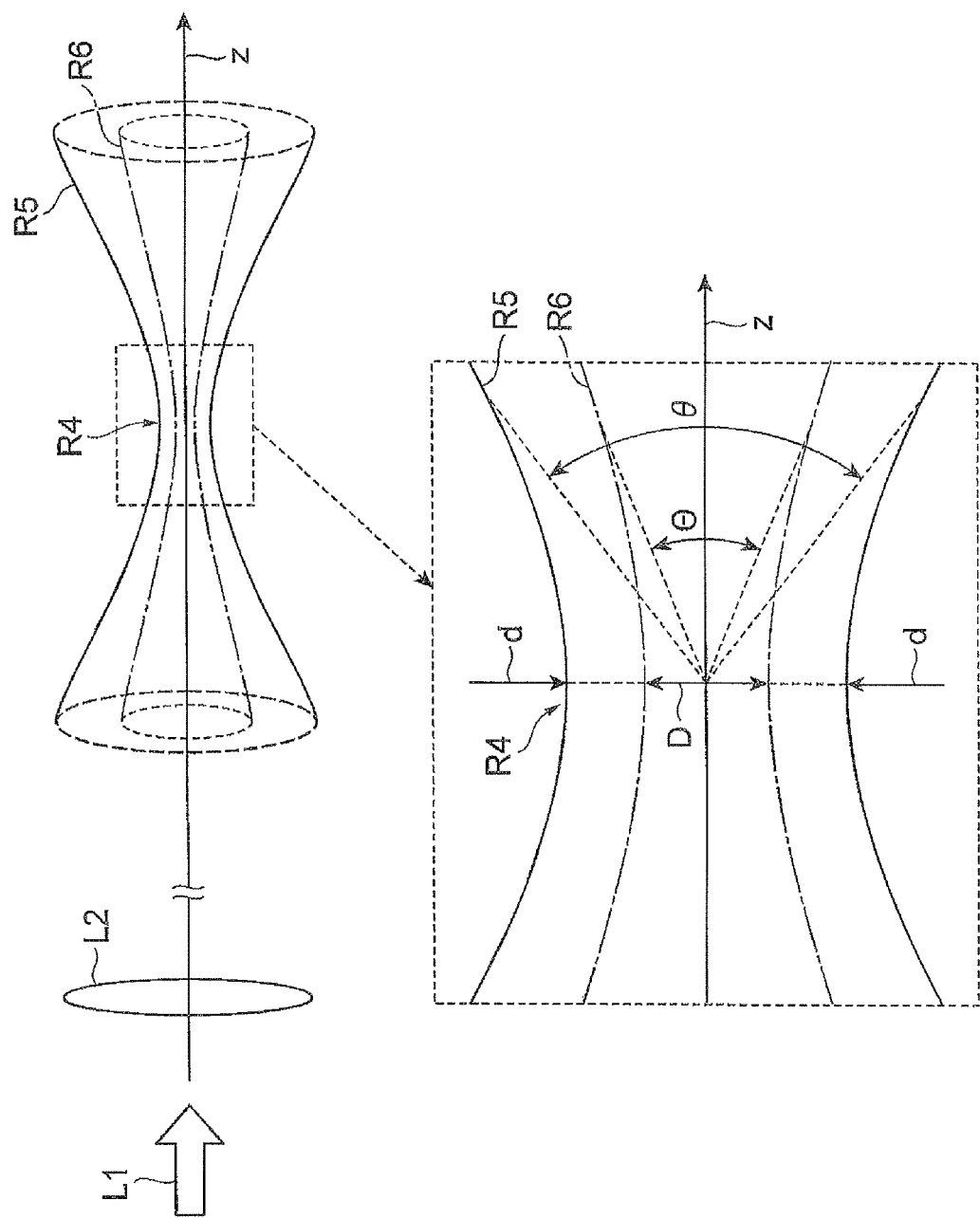
FIG. 4 is a drawing for explaining the beam quality of the semiconductor laser element according to the embodiment.

The beam quality of the semiconductor laser element 1 will be described with reference to FIG. 4. The semiconductor laser element 1 outputs the laser beam L1 in the z-axis direction. The laser beam L1 travels through a lens L2 to be concentrated at a beam waist R4. A beam shape R5 is a beam shape of a standard Gaussian beam. A beam shape R6 is a beam shape of the laser beam L1 from the semiconductor laser element 1. A beam divergence angle θ of the beam shape R5 is larger than a beam divergence angle Θ of the beam shape R6. A converging radius d of the beam shape R5 is larger than a converging radius D of the beam shape R6. The converging radius is a value of the beam radius W at the beam waist R4.

A value obtained by dividing the product of the converging radius D and the beam divergence angle Θ by the product of the converging radius d and the beam divergence angle θ is a value of index $M^2$ and indicates the beam quality. When the value of index $M^2$ is represented by $M^2$, the relation of DΘ=$M^2$dθ holds. For the standard Gaussian beam, the index $M^2$=1. When a laser beam has the index $M^2$>1, the beam quality of this laser beam is lower than that of the standard Gaussian beam. When a laser beam has the index $M^2$<1, the beam quality of this laser beam is higher than that of the standard Gaussian beam. In the case of the semiconductor laser element 1, as shown in FIG. 4, the index $M^2$<1. Namely, the beam quality of the laser beam of the semiconductor laser element 1 is higher than that of the standard Gaussian beam.

Figure 5:
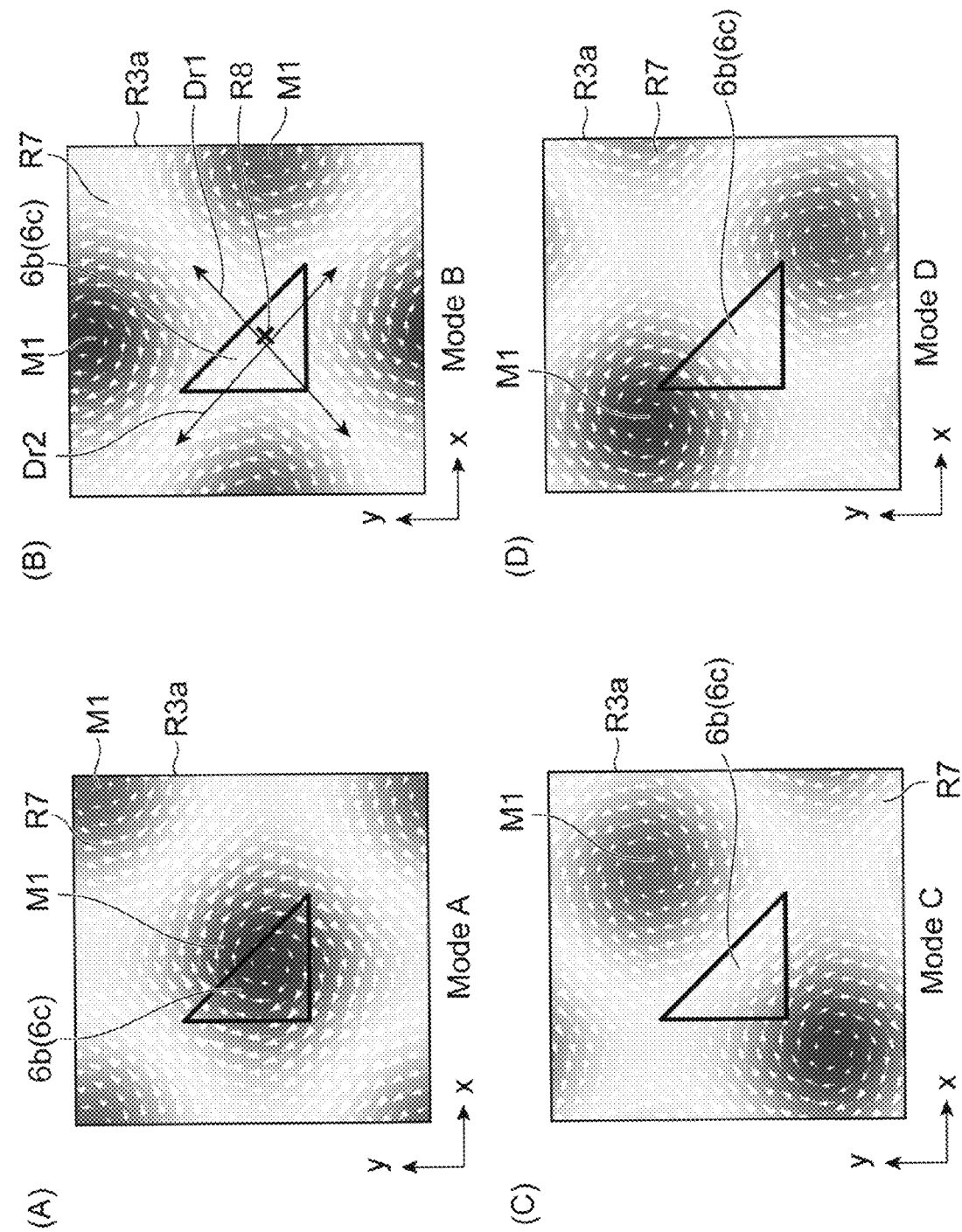
FIG. 5 is a drawing for explaining electromagnetic fields generated by a diffraction grating according to the embodiment.

Modes of electromagnetic fields generated by the diffraction grating 6ba will be described with reference to FIG. 5. The modes of electromagnetic fields generated by the diffraction grating 6ba include four modes near the second Γ point of the square lattice, which are Mode A, Mode B, Mode C, and Mode D shown in part (A) of FIG. 5, part (B) of FIG. 5, part (C) of FIG. 5, and part (D) of FIG. 5, respectively. Each of parts (A) to (D) of FIG. 5 shows the hole 6b arranged in the unit lattice R3a, directions R7 of the electric field in the unit lattice R3a, and a magnetic field distribution M1 in the unit lattice R3a. The magnetic field distribution M1 shows approximately circular regions with relatively high intensity of the magnetic field included in the electromagnetic field generated in the diffraction grating 6ba by luminescence of the active layer 4, and includes extrema of intensity of the magnetic field. In the laser beam L1 of the semiconductor laser element 1, components generated by the electromagnetic field in Mode B are larger than components generated by the respective electromagnetic fields in Mode A, Mode C, and Mode D. In the case of Mode B, a node R8 of the electromagnetic field is located at a position approximately identical with the centroid of the approximate right triangle of the hole 6b (the shape of the bottom face 6c). In the case of Mode B, the magnetic field distribution M1 (the extrema of intensity of the magnetic field in the electromagnetic field generated in the diffraction grating 6ba by luminescence of the active layer 4) is present around the hole 6b. The electric filed components of the electric field around the hole 6b in the case of Mode B are relatively large in a direction Dr1 intersecting with the hypotenuse of the approximate right triangle of the bottom face 6c (corresponding to the third side 6b3 shown in FIG. 3) and in a direction Dr2 extending along this hypotenuse (corresponding to the third side 6b3 shown in FIG. 3).

According to Non Patent Literature 2, the laser beam generated by the electromagnetic field in Mode B has the polarization component with the polarization angle=45° which is larger than the polarization components with the other polarization angles. The polarization component with the polarization angle=45° is a polarization component in a direction extending with an inclination of 45° from the x-axis and the y-axis, in the positive domain of x and the positive domain of y and in the negative domain of x and the negative domain of y.

Figure 18:
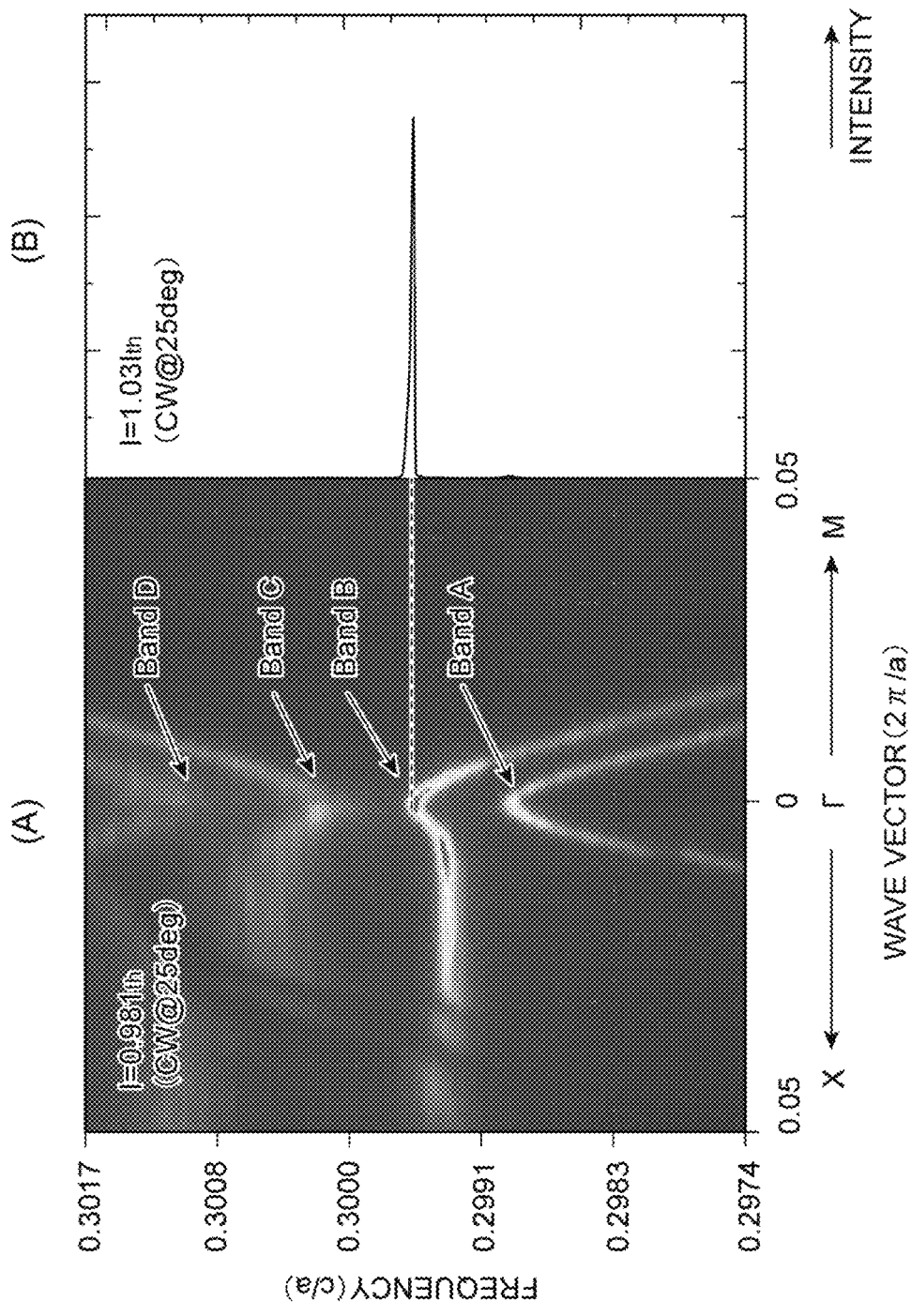
FIG. 18 is a drawing for explaining that a laser beam is oscillated at band edge B in the semiconductor laser element according to the embodiment.

Four light bands (Band A, Band B, Band C, and Band D) shown in FIG. 18 are generated from the diffraction grating 6ba. The laser beam generated by the electromagnetic field in Mode B corresponds to the band edge of the light band in Band B shown in FIG. 18.

Figure 6:
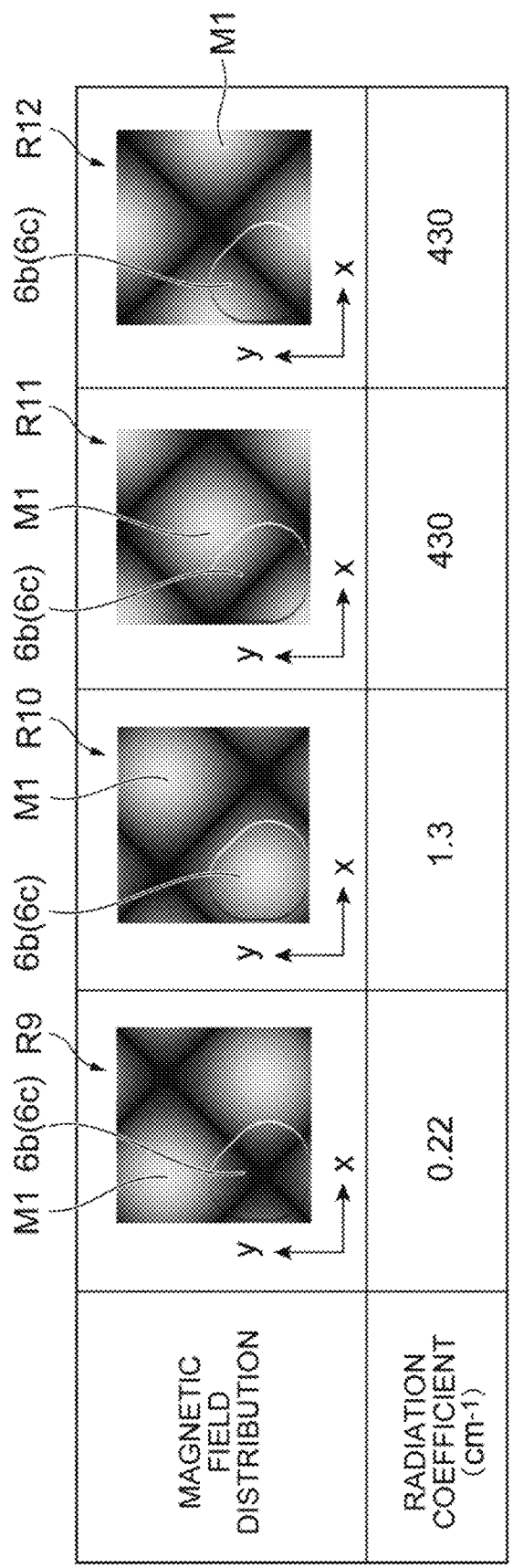
FIG. 6 is a drawing for explaining magnetic field distributions and radiation coefficients in respective modes at four band edges, in an example of the lattice point shape of the diffraction grating according to the embodiment.

FIG. 6 shows an example of calculation for the approximate right triangle of the bottom face 6c of the hole 6b of the diffraction grating layer 6 with the angle Φ=0°, the aspect ratio=1, the roundedness=0.20×a, the filling factor=20%, and the depth of the hole 6b=200 nm. The calculation result shown in FIG. 6 was obtained on the assumption that the material of the diffraction grating layer 6 was GaAs. The following will describe the fact that the laser beam L1 of the semiconductor laser element 1 is generated mainly by the electromagnetic field in Mode B, with reference to FIG. 6. FIG. 6 shows four types of magnetic field distributions generated by the diffraction grating 6ba and radiation coefficients (cm$^{-1}$) corresponding to the respective magnetic field distributions. A radiation coefficient is light leakage (or light output) in the direction perpendicular to the plane in each of Mode A to Mode D. The definition of the radiation coefficient is described in Non Patent Literature 1. The magnetic field distribution R9 corresponds to Mode B, the magnetic field distribution R10 to Mode A, the magnetic field distribution R11 to Mode C, and the magnetic field distribution R12 to Mode D. In the case of the magnetic field distribution R9, the radiation coefficient is the smallest, compared to the other magnetic field distributions. Therefore, in the laser beam L1 of the semiconductor laser element 1, the components generated by the electromagnetic field with oscillation in the magnetic field distribution R9 (Mode B) are more than the components generated by the respective electromagnetic fields with the magnetic field distribution R10 (Mode A), the magnetic field distribution R11 (Mode C), and the magnetic field distribution R12 (Mode D).

Figure 7:
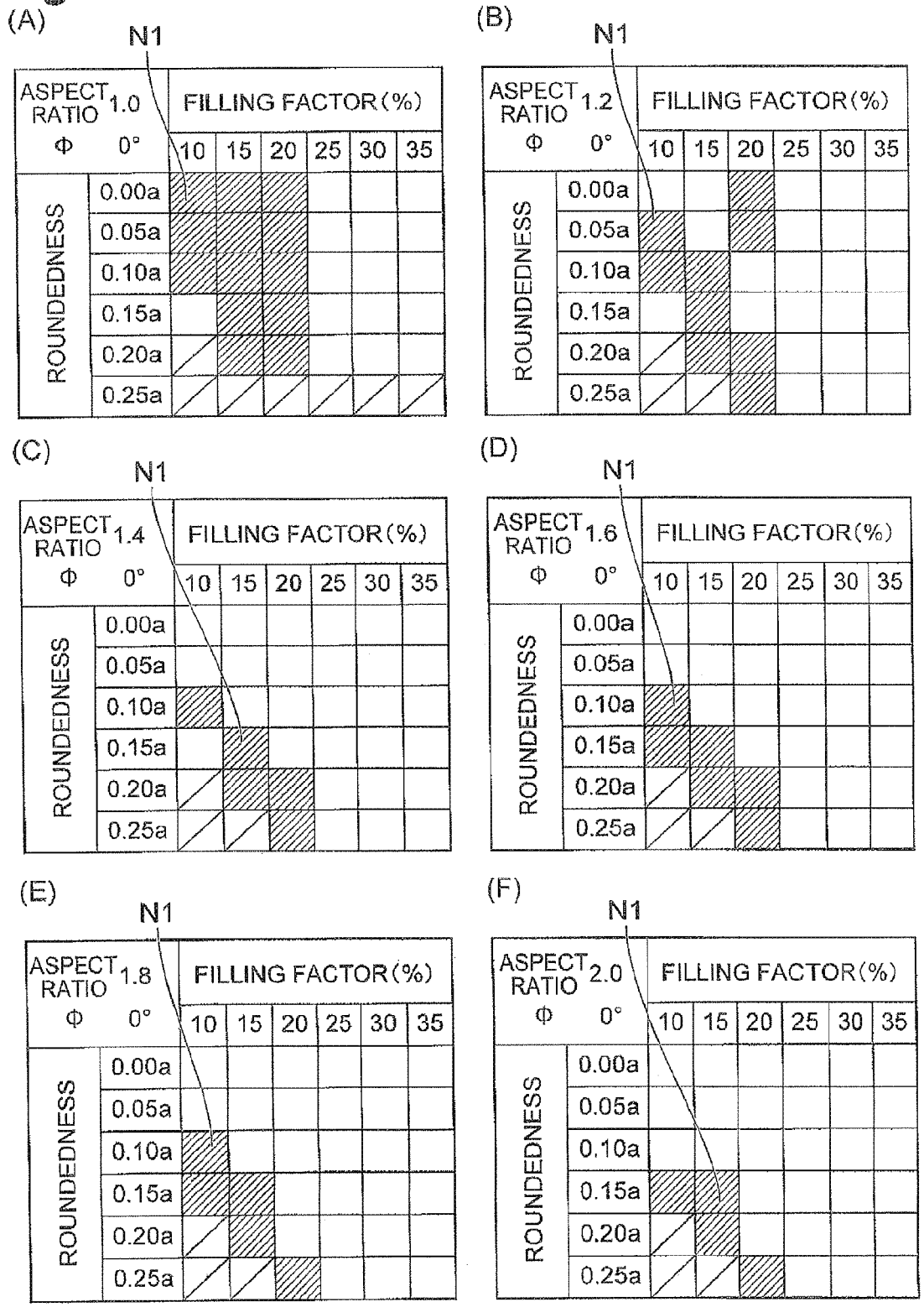
FIG. 7 is a drawing for explaining the configuration of the lattice point of the square lattice according to the embodiment.
Figure 8:
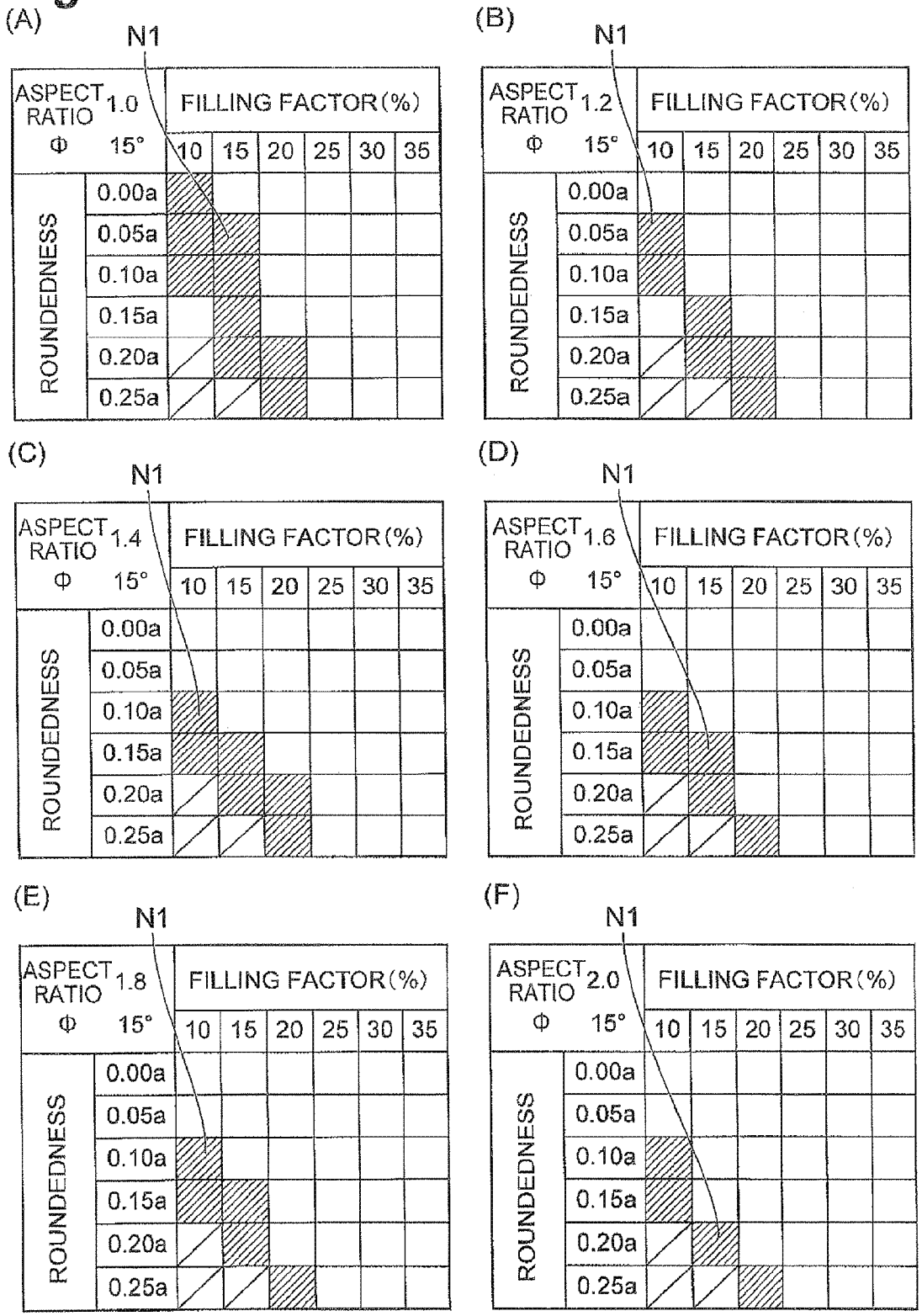
FIG. 8 is a drawing for explaining the configuration of the lattice point of the square lattice according to the embodiment.
Figure 9:
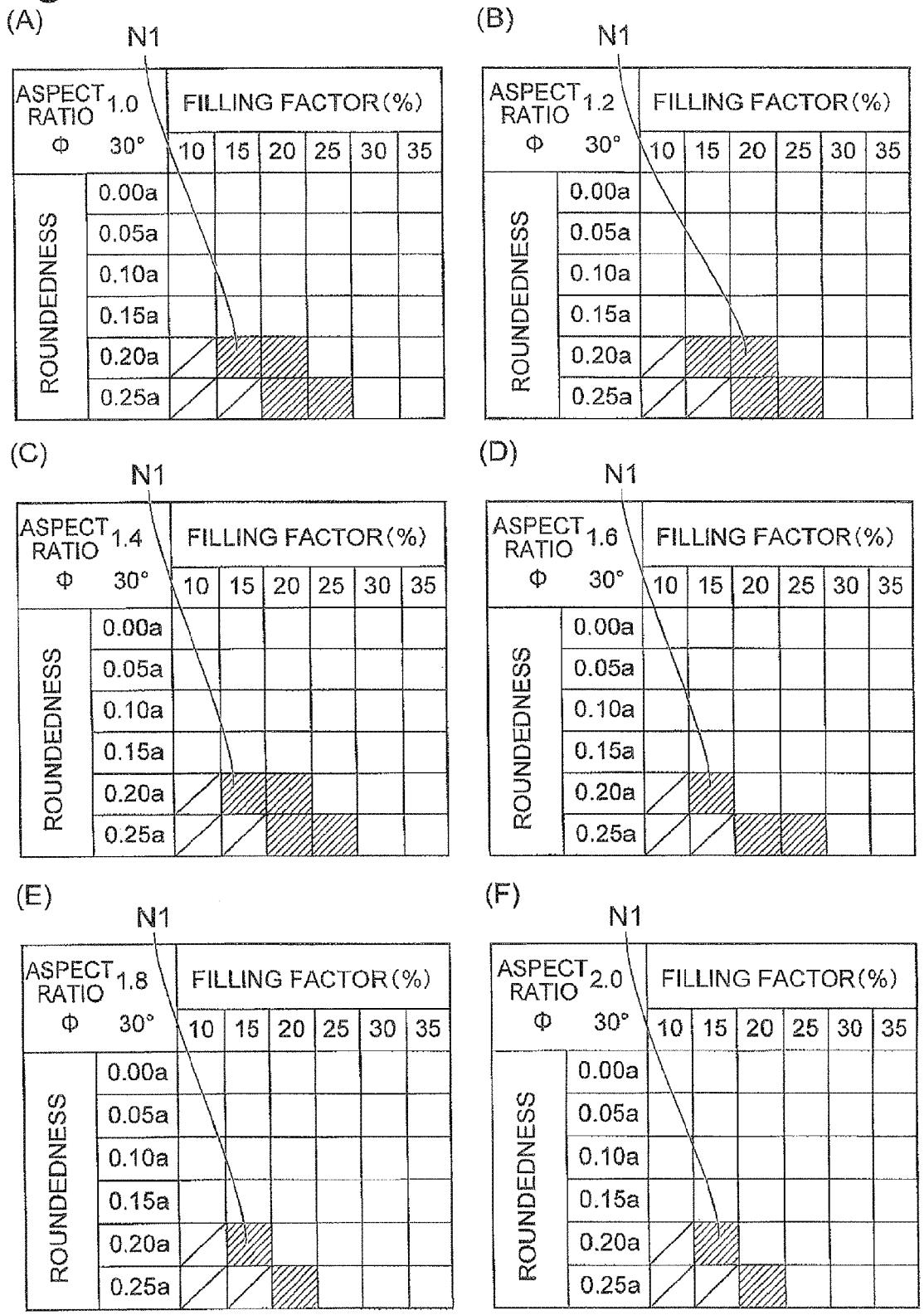
FIG. 9 is a drawing for explaining the configuration of the lattice point of the square lattice according to the embodiment.
Figure 10:
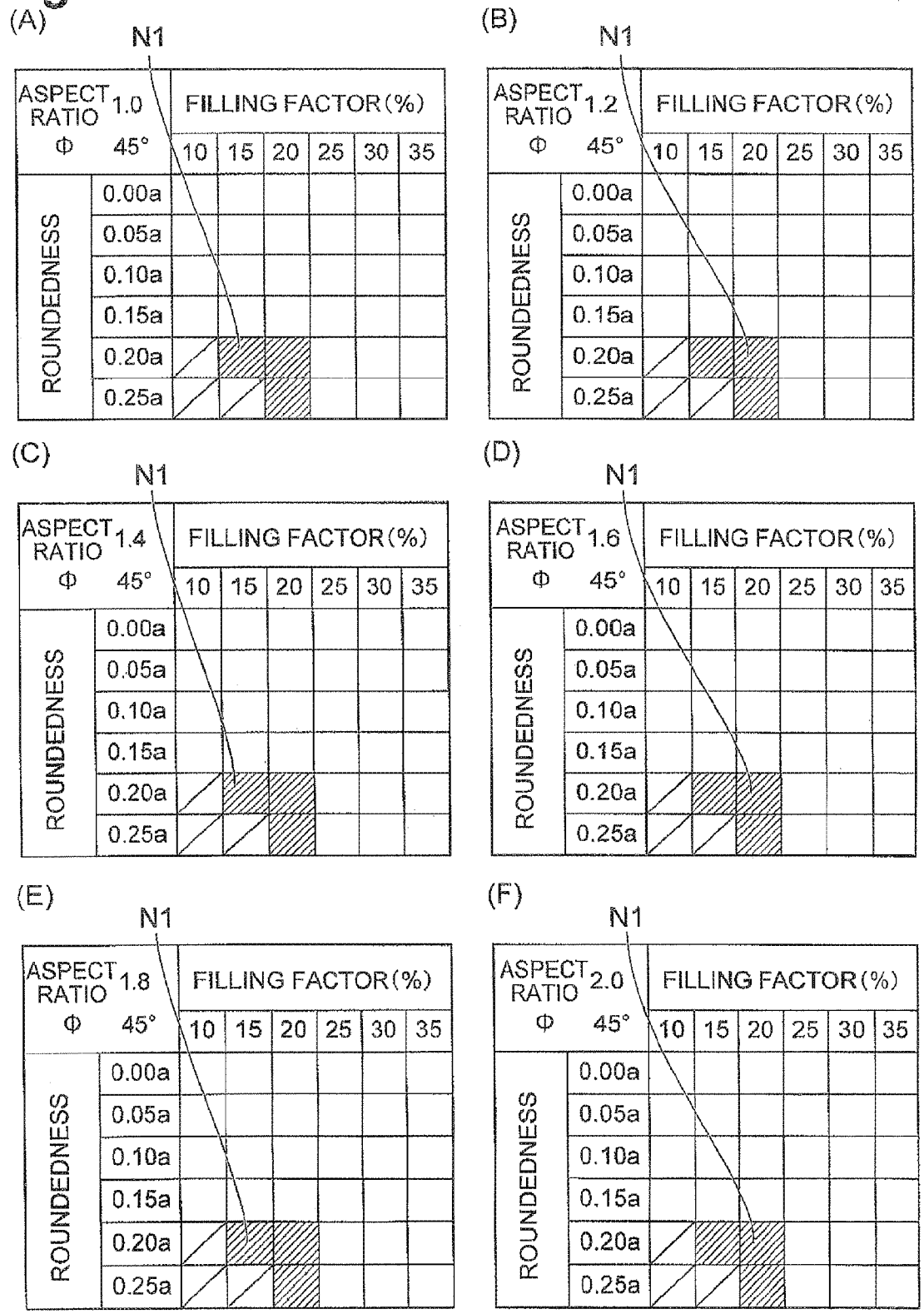
FIG. 10 is a drawing for explaining the configuration of the lattice point of the square lattice according to the embodiment.
Figure 11:
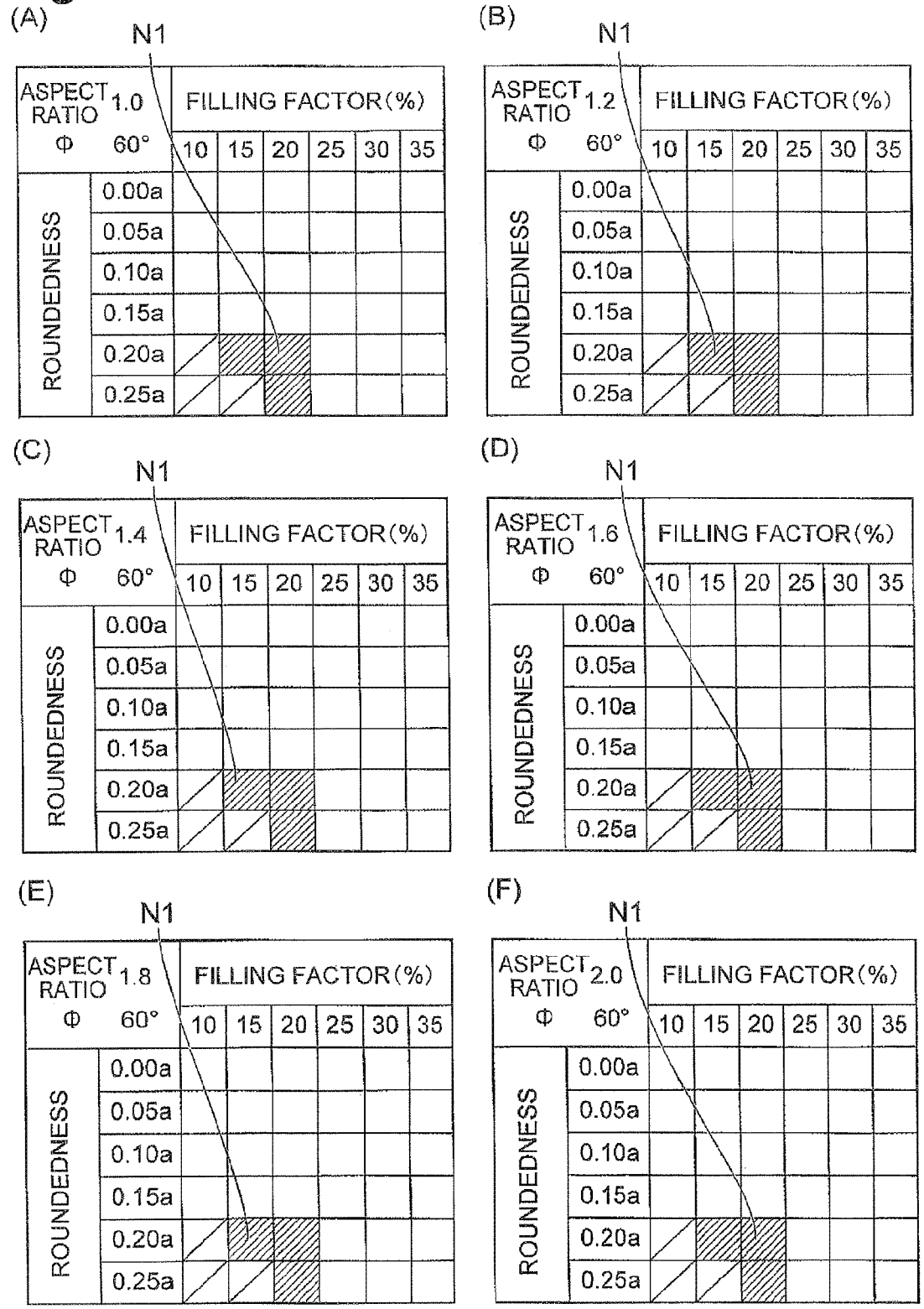
FIG. 11 is a drawing for explaining the configuration of the lattice point of the square lattice according to the embodiment.
Figure 12:
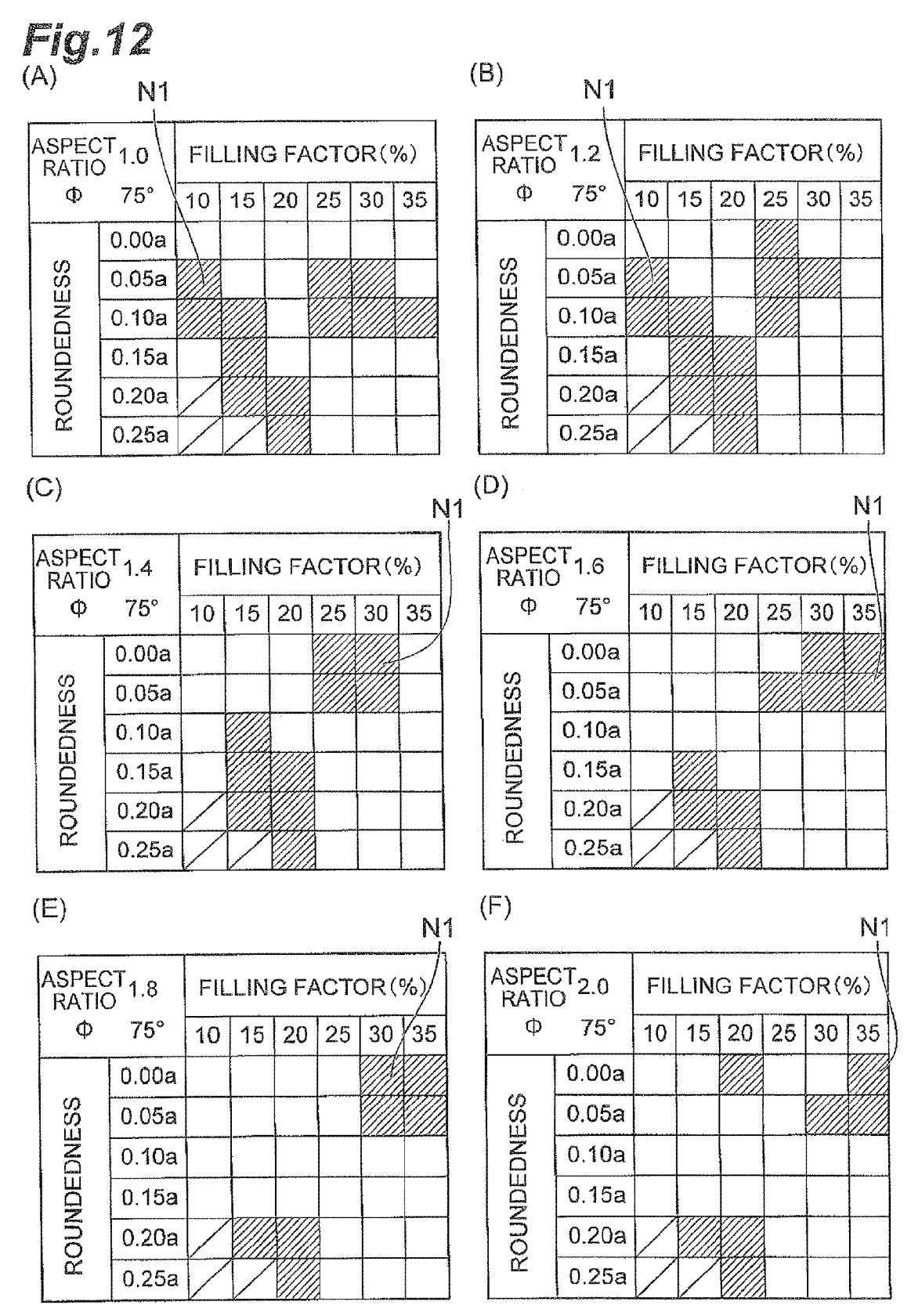

FIGS. 7 to 12 show shapes with which the magnetic field distribution with the smallest radiation coefficient corresponds to Mode B, as the result of calculation of the radiation coefficients in a plurality of variations of the shape of the diffraction grating 6ba. The material of the diffraction grating 6ba giving the calculation results of FIGS. 7 to 12 is GaAs and the depth of the holes 6b in the diffraction grating 6ba giving the calculation results of FIGS. 7 to 12 is 200 nm. The calculation of the radiation coefficients was carried out by use of the three dimensional coupled-wave analysis of infinite periodic structure shown in Non Patent Literature 1 and the shape of the diffraction grating 6ba was defined by the aspect ratio (K2), angle Φ, roundedness (K1), and filling factor (K3). In FIGS. 7 to 12, in the cases of the shapes of hatched portions (hatched portions N1), the magnetic field distribution with the smallest radiation coefficient corresponds to Mode B. FIG. 7 is the calculation results in the cases where the angle Φ is 0°. FIG. 8 is the calculation results in the cases where the angle Φ is 15°. FIG. 9 is the calculation results in the cases where the angle Φ is 30°. FIG. 10 is the calculation results in the cases where the angle Φ is 45°. FIG. 11 is the calculation results in the cases where the angle Φ is 60°. FIG. 12 is the calculation results in the cases where the angle Φ is 75°.

The semiconductor laser element 1 according to the embodiment outputs the laser beam L1 through the diffraction grating 6ba of the diffraction grating layer 6. The diffraction grating 6ba has the plurality of holes 6b (lattice points) of the approximate right triangle arranged along the square lattice R3. In the case of the electromagnetic field mode (Mode B) at the second band edge B from the low frequency side near the second Γ point of the square lattice R3, the node R8 of the electromagnetic field generated in the diffraction grating 6ba by luminescence of the active layer 4 is located approximately at the same position as the centroid of the approximate right triangle of the hole 6b and the extrema of intensity of the magnetic field in the electromagnetic field on the square lattice R3 are present around the hole. It was discovered by Inventor's intensive and extensive research that the beam quality of index $M^2<1$ could be achieved in the case of this Mode B. Therefore, the laser beam L1 output from the semiconductor laser element 1 according to the embodiment has the beam quality of the index $M^2<1$. The value of this index $M^2$ as beam quality is an excellent value not more than one tenth of the values of the index $M^2$ of ordinary broad stripe edge emitting semiconductor lasers and VCSEL (Vertical Cavity Surface Emitting LASER) for high output, enabling reduction in converging radius. Therefore, the semiconductor laser element 1 has a potential of realization of high energy density.

The shape of the opening of the hole 6b as a lattice point is the approximate right triangle. Each of the three vertices (vertex 6b4, vertex 6b5, and vertex 6b6) of the approximate right triangle of the opening of the hole 6b is rounded so as to overlap the circumference of the reference circle Ci tangent at each vertex. It was discovered by Inventor's intensive and extensive research that the beam quality of the index $M^2<1$ could be maintained even if the vertex 6b4, vertex 6b5, and vertex 6b6 were rounded.

The opening of the hole 6b as a lattice point has the first side 6b1 and the second side 6b2. The first side 6b1 and the second side 6b2 make a right angle. The first side 6b1 is inclined relative to the lattice vector VX of the square lattice. In a process of forming the laminate on the diffraction grating layer 6 by the regrowth method of the MOCVD process, the crystal quality of the upper laminate varies depending upon the inclination angle of the approximate right triangle (the angle of inclination relative to the lattice vector). It was discovered by Inventor's intensive and extensive research that the beam quality of the index $M^2$ could be maintained because the oscillation at the band edge B was possible even if the approximate right triangle of the lattice point was inclined relative to the lattice vector. In the steps of manufacturing the semiconductor laser element 1, where the diffraction grating layer 6 and the laminate subsequent thereto are formed by regrowth of the MOCVD process, the quality of the laminate can be optimized by the foregoing inclination, depending upon the shape of the lattice point.

The semiconductor laminate 1a in the semiconductor laser element 1 according to the embodiment can be manufactured using the III-V semiconductors containing GaAs. Since the manufacturing technology has been established for such material system, the manufacture of the semiconductor laser element 1 becomes relatively easier.

In the semiconductor laser element 1 according to the embodiment, the semiconductor laminate 1a further has the electron blocking layer 5 and the electron blocking layer 5 lies between the p-type cladding layer 7 and the active layer 4. The electron blocking layer 5 enables capability for high output. As a similar structure, it is possible to further use a hole blocking layer in combination between the layer with the conductivity type of n-type including the n-type cladding layer 3, and the active layer 4.

In the semiconductor laser element 1 according to the embodiment, the diffraction grating layer 6 lies between the p-type cladding layer 7 and the active layer 4. When the semiconductor laminate 1a is formed from the n-side layer, the diffraction grating layer 6 is formed after formation of the active layer 4 and, for this reason, the active layer 4 is prevented from being directly damaged in a process of processing the diffraction grating layer 6, whereby degradation of the active layer can be avoided.

Figure 13:
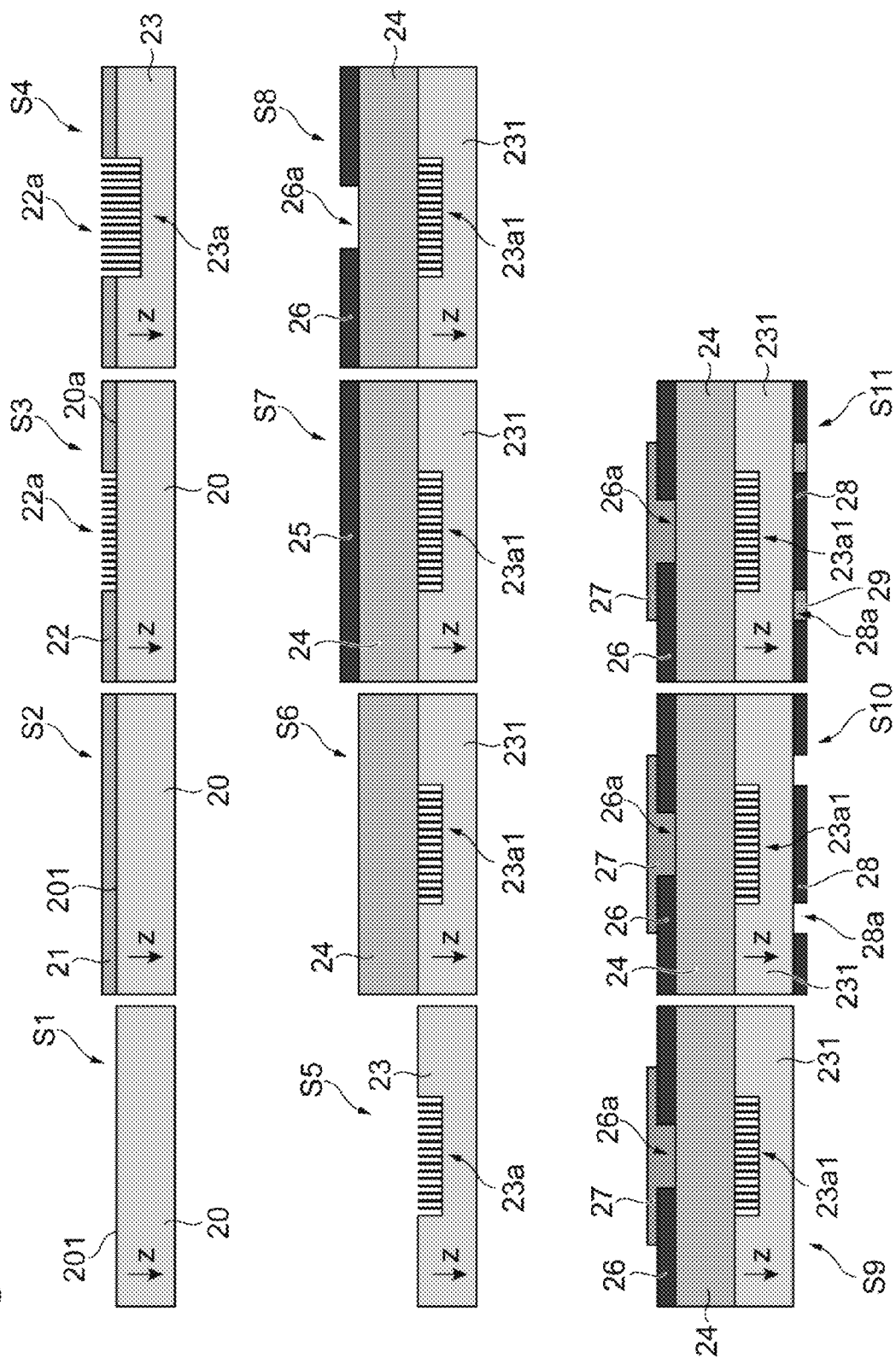
FIG. 13 is a drawing for explaining a method for manufacturing the semiconductor laser element according to the embodiment.

A method for manufacturing the semiconductor laser element 1 will be described with reference to FIGS. 13 and 14. Steps from step S1 to step S11 are successively carried out, thereby manufacturing a substrate product having the configuration of the semiconductor laser element 1. In step S1, a first epitaxial layer structure 20 is grown by the MOCVD process. The layer structure of the first epitaxial layer structure 20 is shown in part (A) of FIG. 14. The first epitaxial layer structure 20 has n-GaAs Substrate 20a, n-AlGaAs Cladding layer 20b, i-AlGaAs Guide layer 20c, i-InGaAs/AlGaAs 3QWs 20d, i-AlGaAs Carrier blocking layer 20e, i-AlGaAs Guide layer 20f, and i-GaAs Guide layer 20g. The n-GaAs Substrate 20a corresponds to the support substrate 2. The n-AlGaAs Cladding layer 20b corresponds to the n-type cladding layer 3. A layer consisting of the i-AlGaAs Guide layer 20c and i-InGaAs/AlGaAs 3QWs 20d corresponds to the active layer 4. A layer consisting of the i-AlGaAs Carrier blocking layer 20e and i-AlGaAs Guide layer 20f corresponds to the electron blocking layer 5. The i-GaAs Guide layer 20g is a layer where the diffraction grating 6ba is formed. A surface 201 of the first epitaxial layer structure 20 is a surface of the i-GaAs Guide layer 20g. The surface 201 corresponds to the p-side surface 6a.

In step S2, a resist 21 is applied onto the surface 201 of the first epitaxial layer structure 20. In step S3, a photonic crystal pattern 22a is exposed on the resist 21 by use of electron beam lithography exposure and the resist is developed with a liquid developer. By this development, the resist 21 turns into a resist 22. The resist 22 has the photonic crystal pattern 22a.

In step S4, dry etching is carried out to transfer a photonic crystal pattern 23a to the i-GaAs Guide layer 20g at the surface 201 of the first epitaxial layer structure 20 from the surface 201 side. By this transfer, the first epitaxial layer structure 20 turns into a second epitaxial layer structure 23. The second epitaxial layer structure 23 has the photonic crystal pattern 23a. The surface where the photonic crystal pattern 23a is formed in the second epitaxial layer structure 23 corresponds to the p-side surface 6a shown in FIG. 1. The photonic crystal pattern 23a and the photonic crystal pattern 22a are the same pattern when viewed from the direction (z-axis direction) perpendicular to the surface 201. The depth of the photonic crystal pattern 23a can be approximately from 100 to 300 nm from the surface 201 when the thickness of the i-GaAs Guide layer 20g is, for example, about 300 nm; e.g., the depth can be about 100 nm from the surface 201, about 200 nm from the surface 201, or about 300 nm from the surface 201. Through step S4, the i-GaAs Guide layer 20g turns into a layer consisting of the i-GaAs Guide layer not including the photonic crystal pattern 23a and the i-GaAs Guide layer including the photonic crystal pattern 23a. Through step S4, the first epitaxial layer structure 20 turns into the second epitaxial layer structure 23. The first epitaxial layer structure 20 has the i-GaAs Guide layer 20g, whereas the second epitaxial layer structure 23 has the layer consisting of the i-GaAs Guide layer not including the photonic crystal pattern 23a and the i-GaAs Guide layer including the photonic crystal pattern 23a, without the i-GaAs Guide layer 20g. Only this difference is the difference between the first epitaxial layer structure 20 and the second epitaxial layer structure 23. After step S4, step S5 is performed to remove the resist 22 from the second epitaxial layer structure 23.

Figure 14:
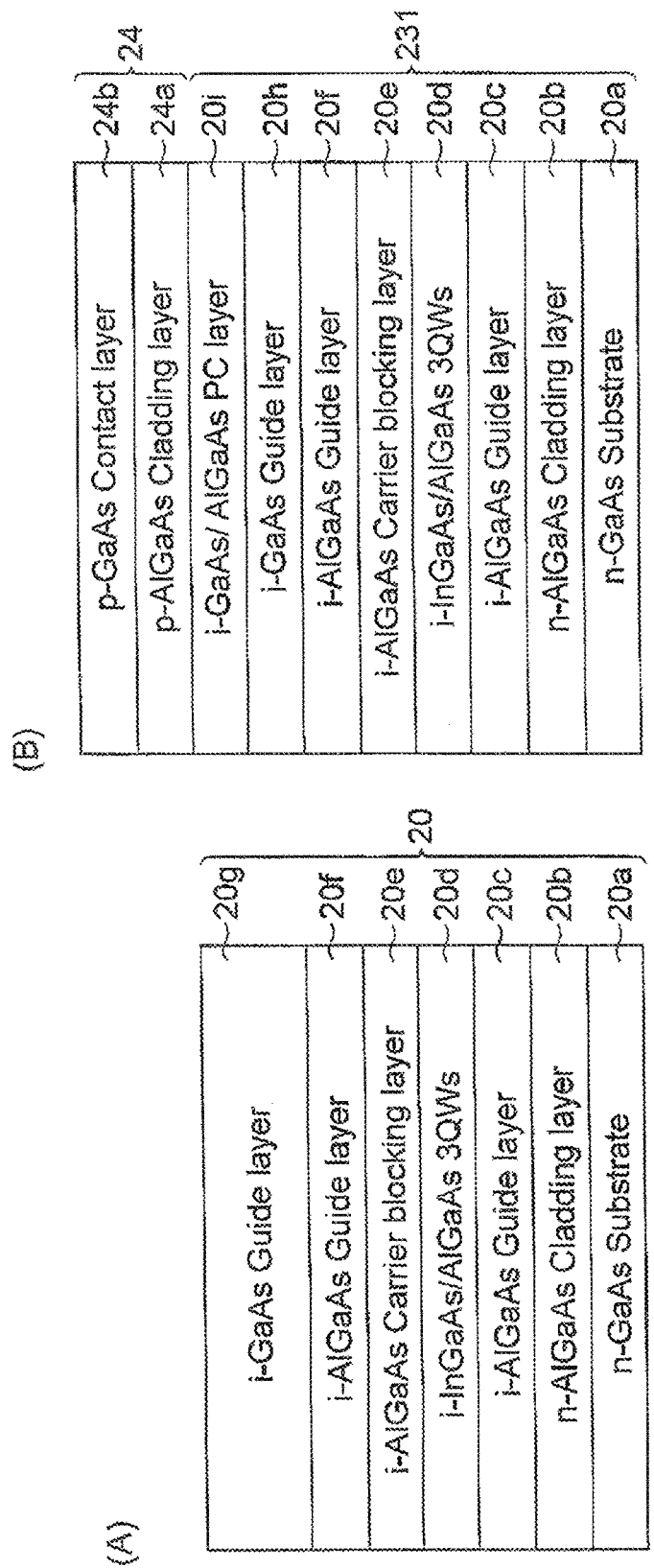
FIG. 14 is a drawing for explaining the structure of the semiconductor laser element according to the embodiment.

In step S6, a common pretreatment is carried out and thereafter a fourth epitaxial layer structure 24 shown in part (B) of FIG. 14 is grown by the MOCVD process. The fourth epitaxial layer structure 24 has p-AlGaAs Cladding layer 24a and p-GaAs Contact layer 24b. The p-AlGaAs Cladding layer 24a grows on the surface of the i-GaAs Guide layer of the second epitaxial layer structure 23 (the surface where the photonic crystal pattern 23a is formed). In the step of growing the p-AlGaAs Cladding layer 24a, AlGaAs adheres to the photonic crystal pattern 23a. The i-GaAs Guide layer including the photonic crystal pattern 23a included in the second epitaxial layer structure 23 turns into i-GaAs/AlGaAs PC layer 20i containing Al (corresponding to the diffraction grating 6ba), with growth of the p-AlGaAs Cladding layer 24a. At this time, hollow spaces (corresponding to the holes 6b) are formed inside the i-GaAs/AlGaAs PC layer 20i. The photonic crystal pattern 23a of the second epitaxial layer structure 23 turns into a photonic crystal pattern 23a1 including AlGaAs and the hollow spaces (corresponding to the holes 6b), with growth of the p-AlGaAs Cladding layer 24a. The i-GaAs/AlGaAs PC layer 20i is a layer including the photonic crystal pattern 23a1. In the end, the i-GaAs Guide layer 20g of the first epitaxial layer structure 20 turns into the layer consisting of the i-GaAs Guide layer 20h and i-GaAs/AlGaAs PC layer 20i, through the transfer of the photonic crystal pattern 23a and the growth of the p-AlGaAs Cladding layer 24a, and the first epitaxial layer structure 20 turns via the second epitaxial layer structure 23 into a third epitaxial layer structure 231. The first epitaxial layer structure 20 has the i-GaAs Guide layer 20g, whereas the third epitaxial layer structure 231 has the layer consisting of the i-GaAs Guide layer 20h and the i-GaAs/AlGaAs PC layer 20i, without the i-GaAs Guide layer 20g. Only this difference is the difference between the first epitaxial layer structure 20 and the third epitaxial layer structure 231. The layer consisting of the i-GaAs Guide layer 20h and the i-GaAs/AlGaAs PC layer 20i corresponds to the diffraction grating layer 6. The steps up to step S6 result in forming the whole of the epitaxial layer structure of PCSEL (corresponding to the semiconductor laminate 1a of the semiconductor laser element 1).

In step S7, an SiN layer 25 is formed on the surface of the fourth epitaxial layer structure 24 (corresponding to the front surface 1a1).

In step S8, using the ordinary exposure development technology and Reactive Ion Etching (RIB), an opening 26a is formed in a shape corresponding to the p-side electrode 27 (square shape of 200 μm square), in the SiN layer 25. By forming the opening 26a, the SiN layer 25 turns into an SiN layer 26. The SiN layer 26 has the opening 26a. In the opening 26a, the surface of the fourth epitaxial layer structure 24 is exposed.

In step S9, a p-side electrode 27 is formed over the opening 26a by lift-off. The p-side electrode 27 is in contact with the p-GaAs Contact layer 24b of the fourth epitaxial layer structure 24, through the opening 26a. The p-side electrode 27 corresponds to the p-side electrode 10.

A material of the p-side electrode 27 to be used can be a material for the electrodes provided on the semiconductor layers of GaAs-based materials. The material of the p-side electrode 27 can be, for example, a metal such as Au, Ti, Pt, or Cr. The p-side electrode 27 can be, for example, Ti/Pt/Au, Ti/Au, Cr/Au, or the like in order from the GaAs semiconductor layer side. The p-GaAs Contact layer 24b in contact with the p-side electrode 27 is doped with an impurity in a high concentration of not less than $1 \times 10^{19}/cm^{-3}$.

In step S10, the back surface of the third epitaxial layer structure 231 (corresponding to the back surface 1a2) is polished and an SiN layer 28 is formed at a location (location immediately below the p-side electrode 27) on the back surface (corresponding to the back surface 1a2) after polished, by use of the exposure development technology. The SiN layer 28 also has a function as an anti-reflection coat. An optical film thickness of the SiN layer 28 is λ/4 (λ is the oscillation wavelength) of the oscillation wavelength of the semiconductor laser element 1. The SiN layer 28 has an opening 28a. In the opening 28a, the back surface of the third epitaxial layer structure 231 is exposed.

In step S11, an n-side electrode 29 is formed by lift-off. The n-side electrode 29 has a shape surrounding a surface emission region on the back surface of the third epitaxial layer structure 231. The n-side electrode 29 corresponds to the n-side electrode 9.

A material of the n-side electrode 29 to be used can be a material for the electrodes provided on the semiconductor layers of GaAs-based materials. The material of the n-side electrode 29 can be, for example, a mixture of a metal such as Au with a semiconductor such as Ge. The n-side electrode can be, for example, AuGe, AuGe/Au, or the like.

After completion of execution of the steps from step S1 to step S11 described above, the substrate product having the configuration of the semiconductor laser element 1 is manufactured. After step S11, the substrate product manufactured by the steps up to step S11 is divided into chips of a plurality of semiconductor laser elements 1.

Figure 15:
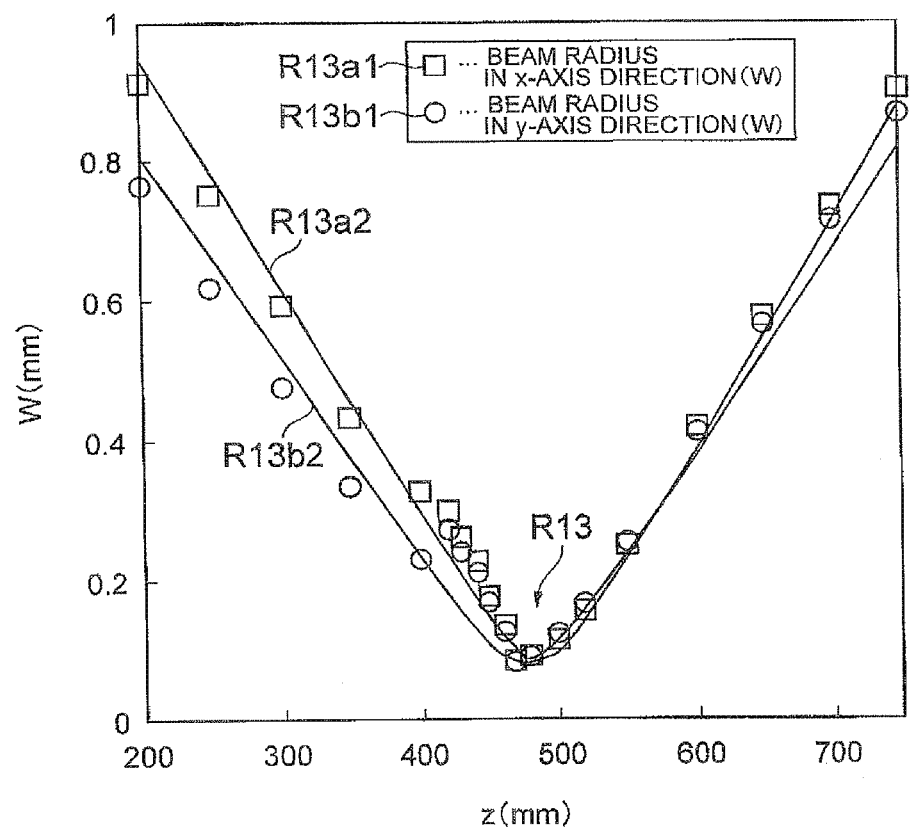
FIG. 15 is a drawing for explaining the beam quality of the semiconductor laser element according to the embodiment.
Figure 16:
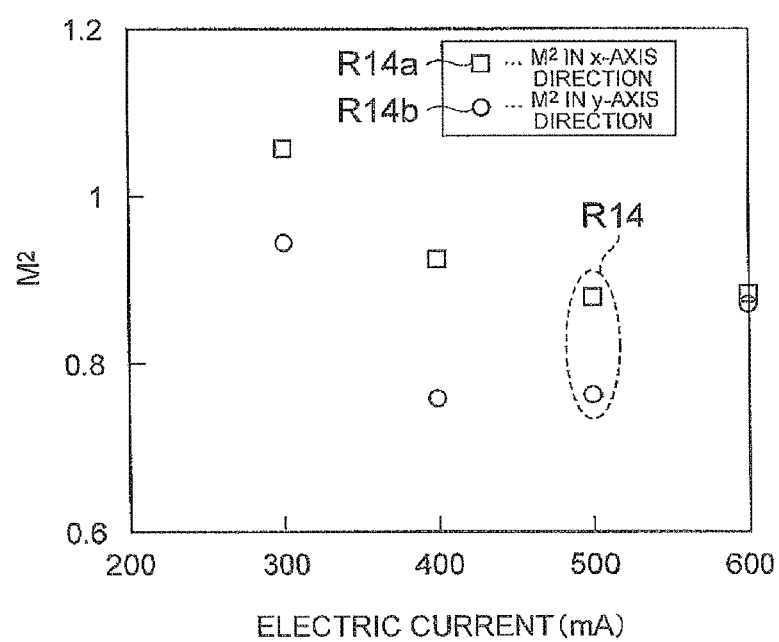
FIG. 16 is a drawing for explaining the beam quality of the semiconductor laser element according to the embodiment.

Example of the semiconductor laser element 1 will be described with reference to FIGS. 15 to 22. FIGS. 15 to 17 are drawings for explaining the beam quality of Example of the semiconductor laser element 1. First, the beam radius W of the laser beam L1 of Example was measured. The electric current injected into Example was approximately 500 mA. Each of a plurality of marks R13a1 indicates a measurement of the beam radius W (mm) in the x-axis direction. Each of a plurality of marks R13b1 indicates a measurement of the beam radius W (mm) in the y-axis direction. A curve R13a2 is a curve obtained by fitting to the measurements of the beam radius W in the x-axis direction. A curve R13b2 is a curve obtained by fitting to the measurements of the beam radius W in the y-axis direction. In the laser beam L1 of Example, the beam waist R13 corresponds to the beam waist R4 in FIG. 4. The measurement results R14 in FIG. 16 indicate the result of calculation of the index $M^2$ in the x-axis direction using the curve R13a2 and the result of calculation of the index $M^2$ in the y-axis direction using the curve R13b2. Each mark R14a in FIG. 16 indicates the index $M^2$ in the x-axis direction. Each mark R14b in FIG. 16 indicates the index $M^2$ in the y-axis direction.

The injected current into Example was set not only at 500 mA but also at 300 mA, 400 mA, and 600 mA; the same measurement as in FIG. 15 was performed using each of the injected currents; the index $M^2$ in the x-axis direction and the index $M^2$ in the y-axis direction were calculated at each of the injected currents; the calculation results are shown in FIG. 16. Numerals corresponding to the results shown in the graph of FIG. 16 are shown in FIG. 17. As shown in FIGS. 16 and 17, it is seen that the index $M^2$ in the x-axis direction and the index $M^2$ in the y-axis direction are smaller than 1, particularly, at the injected currents of 400 mA, 500 mA, and 600 mA. When the injected current is 300 mA, the index $M^2$ in the y-axis direction is smaller than 1. When the injected current is 300 mA, the index $M^2$ in the x-axis direction is larger than 1 but almost close to 1, a relatively small value.

Part (A) of FIG. 18 shows the result of imaging of photonic bands immediately before oscillation of Example of the semiconductor laser element 1 and part (B) of FIG. 18 an oscillation spectrum immediately after oscillation of the laser beam L1 of Example. The unit of wave number on the horizontal axis in part (A) of FIG. 18 is 2π/a (a is the value of the lattice constant a of the square lattice R3) and the unit of frequency on the vertical axis in part (A) of FIG. 18 is c/a (c is the speed of light in vacuum; a is the value of the lattice constant a of the square lattice R3). The photonic bands near the second Γ point of the semiconductor laser element 1 are four types, Band A, Band B, Band C, and Band D. The wave vector of Γ–X corresponds to the x-axis direction. The wave vector of Γ–M corresponds to the direction extending at 45° to the x-axis and the y-axis. It is understood that the laser beam L1 is oscillated at the band edge B, by correspondence between the oscillation spectrum immediately after the oscillation of the laser beam L1 shown in part (B) of FIG. 18 and the photonic band immediately before the oscillation shown in part (A) of FIG. 18. The imaging result of the light bands shown in FIG. 18 were obtained by injecting the electric current of 0.98×Ith into Example, where the threshold current Ith is equal to 190 mA, in the environment of 25° C., so as to implement continuous oscillation of Example. The measurement result of the intensity spectrum shown in FIG. 18 was obtained by injecting the electric current of 1.03×Ith into Example in the environment of 25° C., so as to implement continuous oscillation of Example.

Figure 19:
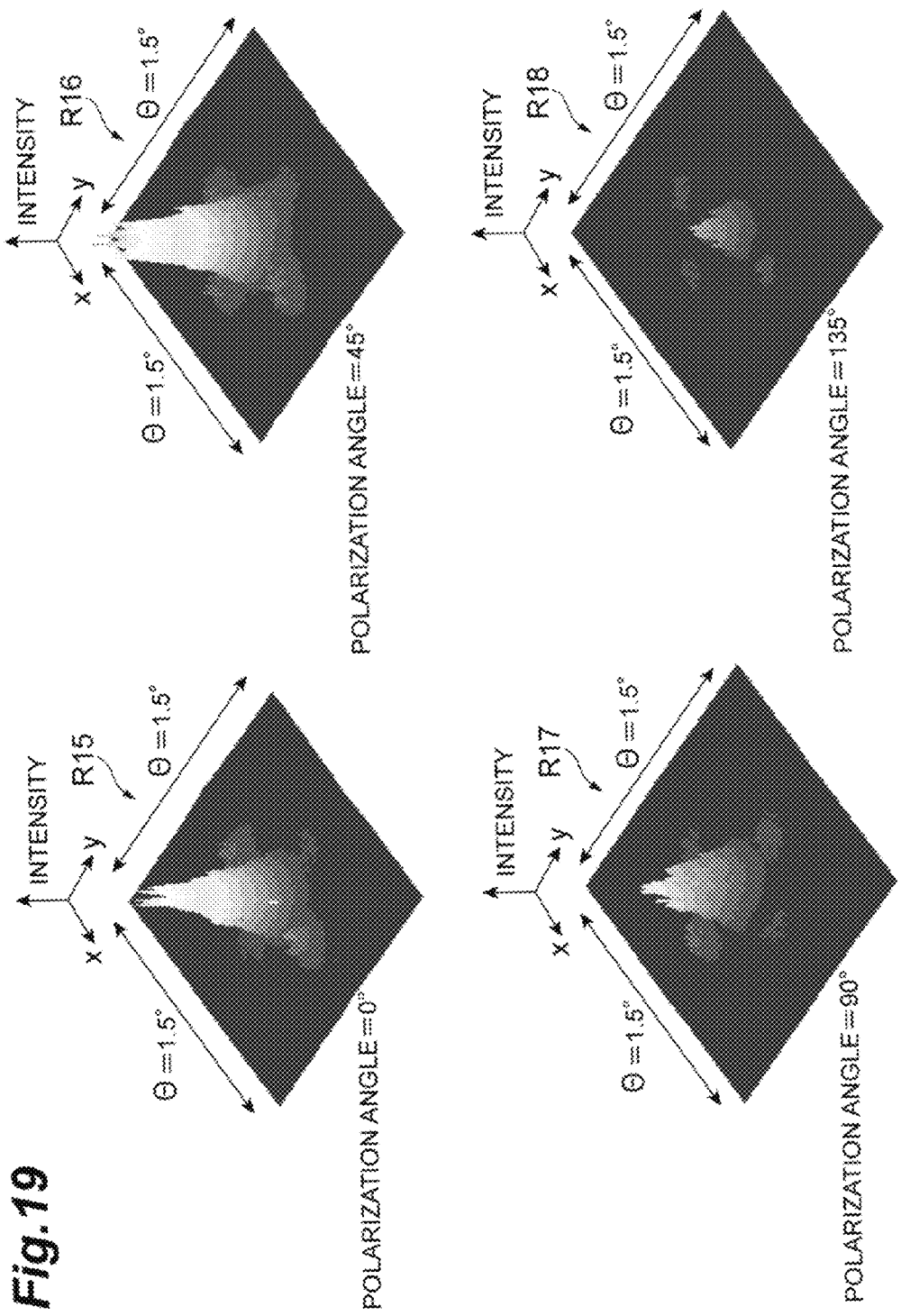
FIG. 19 is a drawing illustrating polarization angle dependence of the laser beam of the semiconductor laser element according to the embodiment, and drawing for explaining that contribution of Mode B to oscillated electromagnetic field modes is significant.

FIG. 19 shows the results of measurement of beam intensity of the laser beam L1 from Example of the semiconductor laser element 1, for each of four types of polarization components (or for each of four types of polarization angles). The measurement result R15 is the result of measurement of beam intensity of the polarization component with the polarization angle=0° of the laser beam L1, in the range of the beam divergence angle Θ of 1.5°. The polarization component with the polarization angle=0° is the polarization component in the x-axis direction. The measurement result R16 is the result of measurement of beam intensity of the polarization component with the polarization angle=45° of the laser beam L1, in the range of the beam divergence angle Θ of 1.5°. The polarization component with the polarization angle=45° is the polarization component in the direction extending at the inclination of 45° from the x-axis and the y-axis, in the positive x domain and positive y domain and in the negative x domain and negative y domain. The measurement result R17 is the result of measurement of beam intensity of the polarization component with the polarization angle=90° of the laser beam L1, in the range of the beam divergence angle Θ of 1.5°. The polarization component with the polarization angle=90° is the polarization component in the y-axis direction. The measurement result R18 is the result of measurement of beam intensity of the polarization component with the polarization angle=135° of the laser beam L1, in the range of the beam divergence angle Θ of 1.5°. The polarization component with the polarization angle=135° is the polarization component in the direction extending at the inclination of 45° from the x-axis and the y-axis, in the positive x domain and negative y domain and in the negative x domain and positive y domain. The measurement result R15 to the measurement result R18 were obtained by injecting the electric current of about 500 mA into Example in the environment of 25° C. to implement continuous oscillation of Example.

Figure 20:
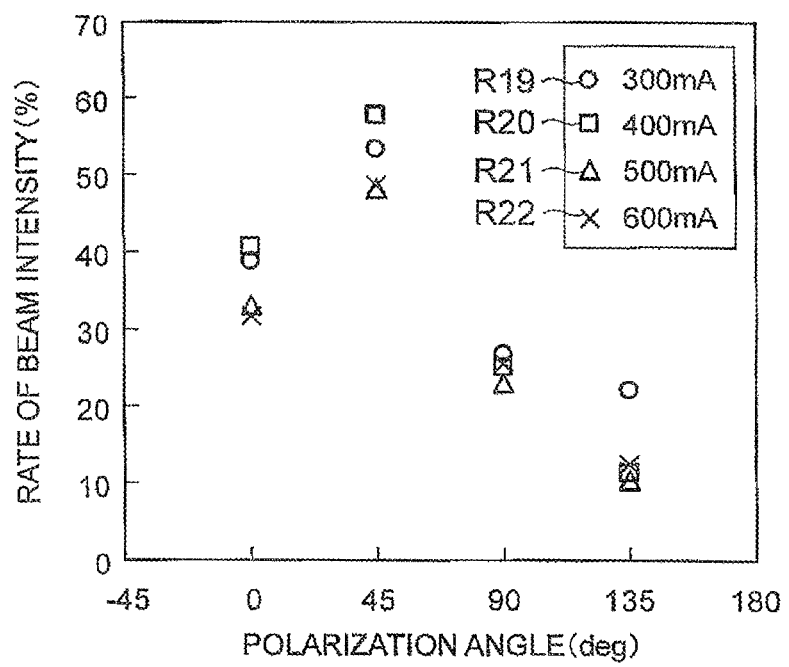
FIG. 20 is a drawing for illustrating the polarization angle dependence of the laser beam of the semiconductor laser element according to the embodiment, and drawing for explaining that the contribution of Mode B to oscillated electromagnetic field modes is significant.

The injected current into Example was set at 300 mA, 400 mA, and 600 mA, in addition to 500 mA, the same measurement as in FIG. 19 was carried out by use of each of the injected currents, and rates of beam intensity for the respective polarization components were calculated at each of the injected currents; the calculation results are shown in FIG. 20. The horizontal axis of FIG. 20 represents the polarization angle (°). The vertical axis of FIG. 20 represents the rate (%) of beam intensity. Each mark R19 indicates the measurement result obtained by the injected current of 300 mA, each mark R20 the measurement result obtained by the injected current of 400 mA, each mark R21 the measurement result obtained by the injected current of 500 mA, and each mark R22 the measurement result obtained by the injected current of 600 mA. The rate of beam intensity for each polarization component refers to a rate (%) of the beam intensity of each polarization component to the whole beam intensity. The beam intensities were measured in the range of the beam divergence angle Θ of 1.5°. With reference to FIG. 20, the beam intensities of the polarization component with the polarization angle=45° are the largest, compared to the polarization components with the other polarization angles, in the laser beam L1 of Example. The components generated by the electromagnetic field in Mode B shown in part (B) of FIG. 5 include a larger part of the polarization component with the polarization angle=45°, than the other polarization components (Non Patent Literature 2). Therefore, it is seen that the laser beam L1 of Example is one generated by the electromagnetic field in Mode B.

With reference to FIGS. 18 to 20, it is understood that the laser beam L1 of Example of the semiconductor laser element 1 mainly includes the components generated by the electromagnetic field in Mode B shown in part (B) of FIG. 5. It is seen that the components generated by the electromagnetic field in Mode B realize the index $M^2$ smaller than 1.

Figure 21:
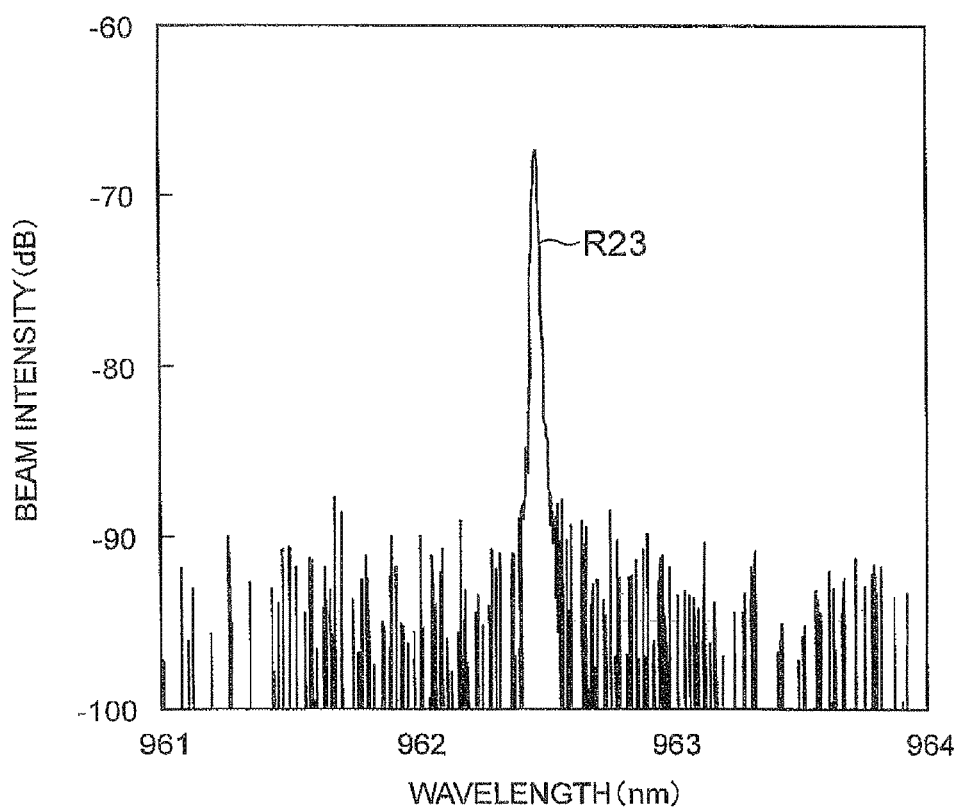
FIG. 21 is a drawing for explaining an oscillation spectrum at an injected current of 500 mA, in the semiconductor laser element according to the embodiment.

FIG. 21 shows an intensity spectrum of the laser beam L1 in Example of the semiconductor laser element 1. The horizontal axis of FIG. 21 represents the wavelength (nm) and the vertical axis the beam intensity (dB). It is seen with reference to FIG. 21 that the laser beam L1 has a peak R23 in the wavelength range from 962 nm to 963 nm. Therefore, the laser beam L1 is found to be a single mode.

FIG. 22 shows SEM (Scanning Electron Microscope) images in the manufacturing process of Example of the semiconductor laser element 1. The SEM images shown in FIG. 22 are SEM images of the photonic crystal pattern corresponding to the photonic crystal pattern 23a at the stage of step S5 in FIG. 13. The SEM image in part (A) of FIG. 22 is an image of the pattern viewed from the opposite side to the n-GaAs Substrate 20a, and the SEM image in part (B) of FIG. 22 an image of the photonic crystal pattern 23a viewed from the orientation flat side of the substrate product consisting of the second epitaxial layer structure 23. The lattice constant a of the photonic crystal pattern 23a in the SEM images of FIG. 22 is 290 nm.

Figure 23:
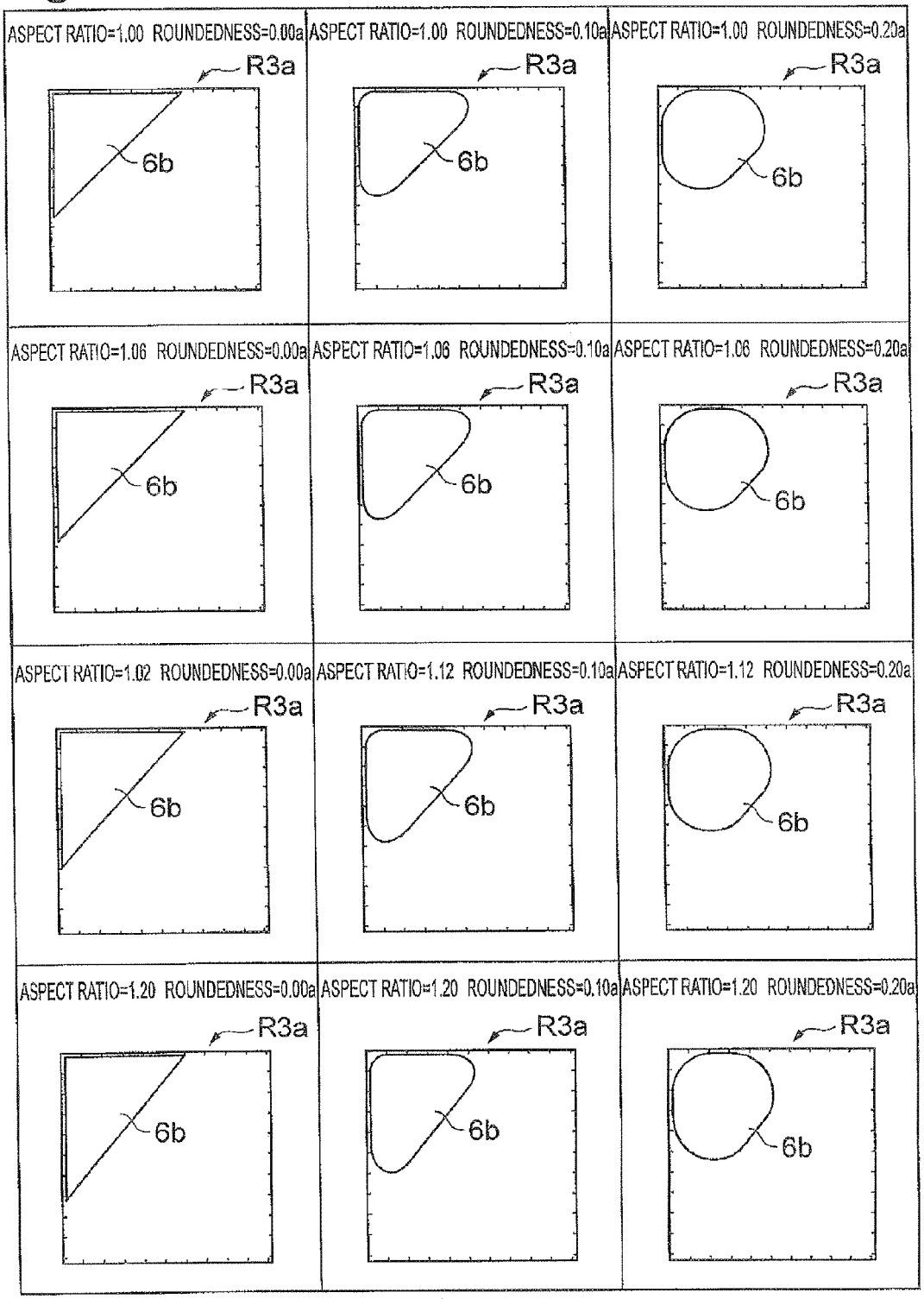
FIG. 23 is a drawing showing specific examples of the shape of the unit lattice.

FIG. 23 show shapes of the unit lattice R3a with the aspect ratios (1.00, 1.06, 1.12, and 1.20) including the aspect ratio (1.0) in part (A) of FIG. 7. In all the shapes of the unit lattice R3a shown in FIG. 23, the filling factor of the hole 6b is 20(%) and the angle Φ the same (0°) as the angle Φ of the shape shown in FIG. 7.

Figure 24:
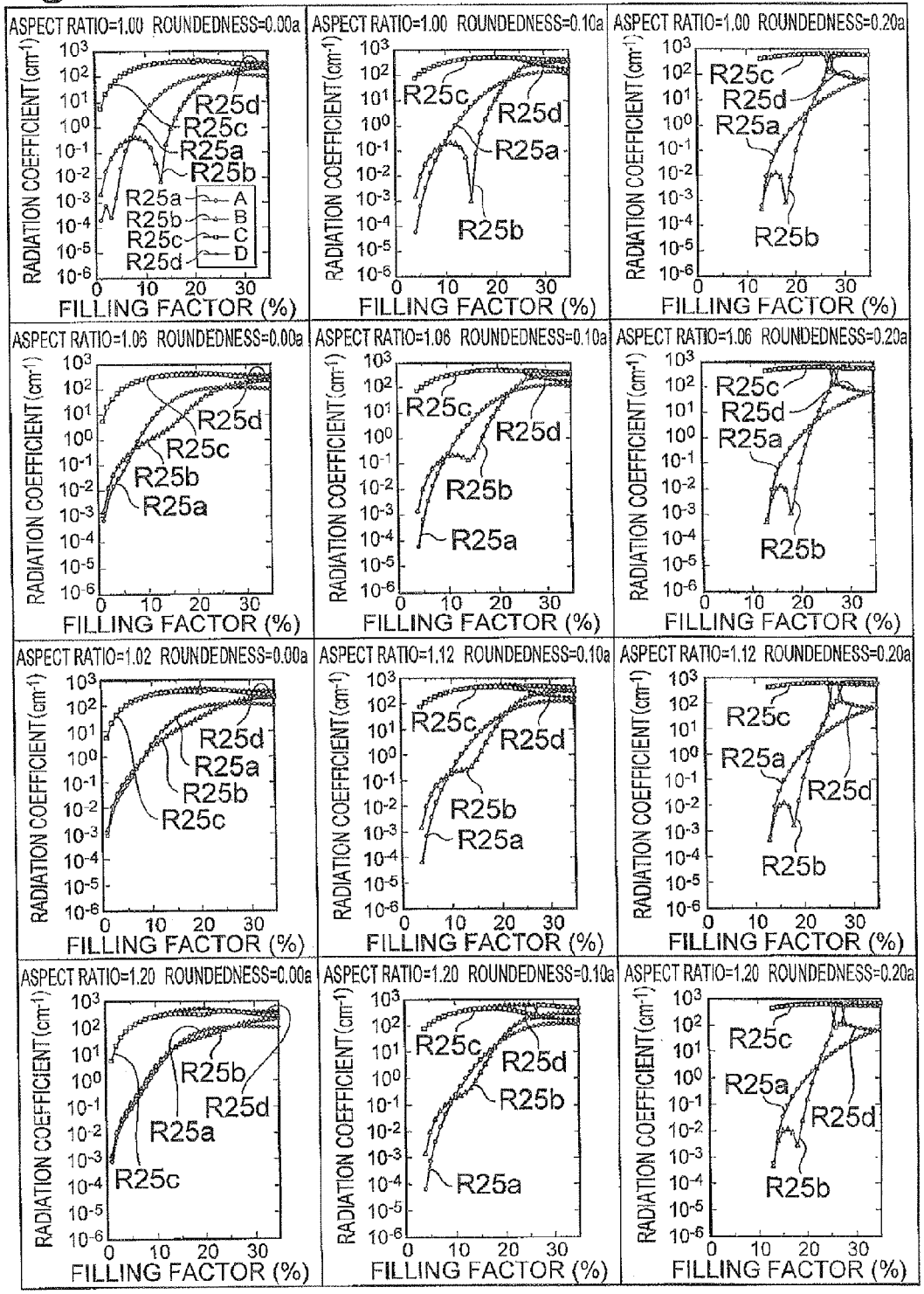
FIG. 24 is a drawing showing correlations between radiation coefficient and filling factor in each of four types of electromagnetic field modes.

FIG. 24 shows correlations between the radiation coefficient ($cm^{-1}$) and filling factor in each of the four types of electromagnetic field modes (Modes A, B, C, and D), for the respective shapes of the unit lattice R3a shown in FIG. 23. Graph R25a corresponds to Mode A, graph R25b to Mode B, graph R25c to Mode C, and graph R25d to Mode D. In the device structure shown in FIG. 1, when the lengths in the x-direction and y-direction of the photonic crystal structure are set to sufficiently large values, light leakage into the x-direction and y-direction not contributing to optical output can be kept sufficiently small. In the simulations shown in the present embodiment, an ideal state is considered to be a case where the lengths in the x-direction and y-direction are infinite. In this case, the light leakage into the x-direction and y-direction is zero and, the light leakage into the z-direction or the radiation coefficient coincides with the light leakage into all directions or threshold gain. Therefore, the radiation coefficient difference will be referred to hereinafter as threshold gain difference.

The electromagnetic field mode used in the present embodiment is Mode B as described above, out of the four types of electromagnetic field modes (Modes A, B, C, and D). When the threshold gain of Mode B is the lowest among the four types of electromagnetic field modes, oscillation in Mode B can be expected. It is seen from the simulation results of the threshold gains shown in FIG. 24 that the electromagnetic field mode with the next lowest threshold gain to Mode B is Mode A, in all the cases where Mode B has the lowest threshold gain among the four types of electromagnetic field modes. In the simulation results of threshold gains shown in FIG. 24, stabler oscillation can be expected as the threshold gain difference between Mode B and Mode A becomes larger.

Figure 25:
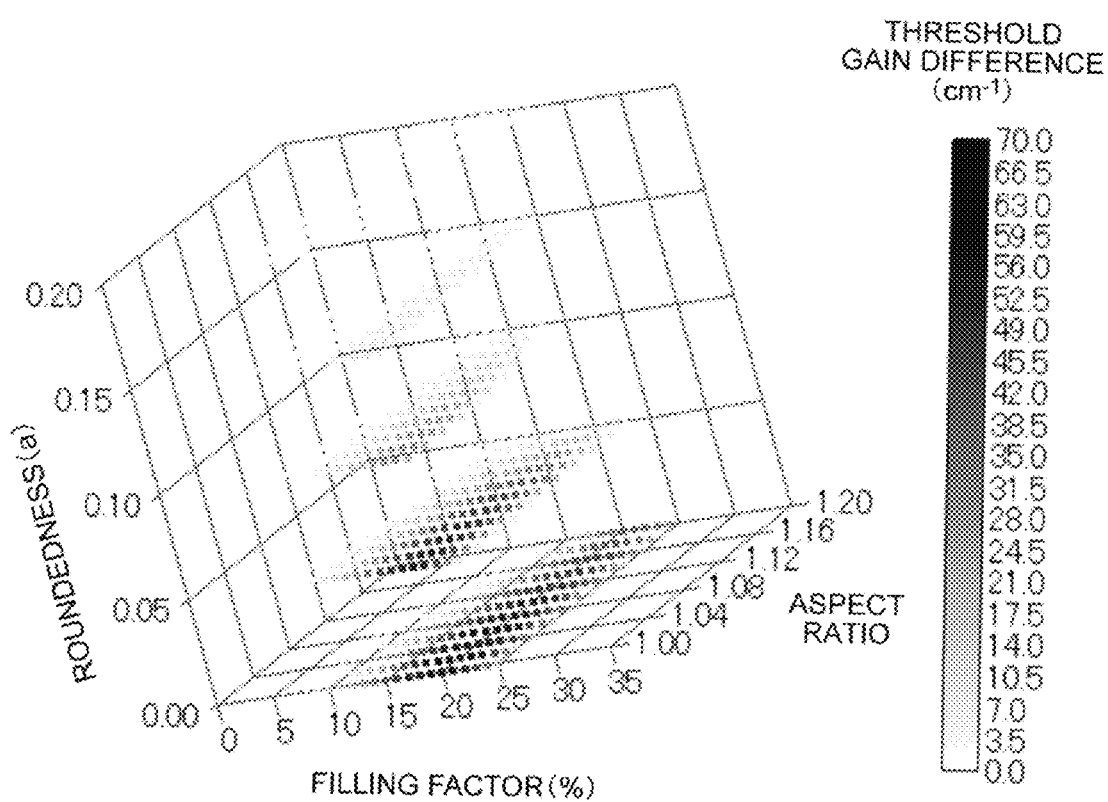
FIG. 25 is a drawing showing the simulation result of threshold gain difference between Mode A and Mode B.

FIG. 25 shows the simulation results of threshold gain difference between Mode A and Mode B. In FIG. 25, dark colored portions indicate ranges where the threshold gain difference is large (i.e., where stabler oscillation can be expected), and light colored portions indicate portions where the threshold gain difference is small. As shown in FIG. 25, the threshold gain difference between Mode A and Mode B demonstrates monotonic variation. Particularly, the threshold gain difference is the largest with the unit lattice R3a of the shape with the filling factor of 15 to 20%, the aspect ratio of 1.00, and the roundedness of 0.00×a (a is the lattice constant) and, with variation from this shape, the threshold gain difference between Mode A and Mode B monotonically decreases. In portions without data points in FIG. 25, the difference is considered to vary continuously from the data points in FIG. 25, because of the physical background described below.

Figure 26:
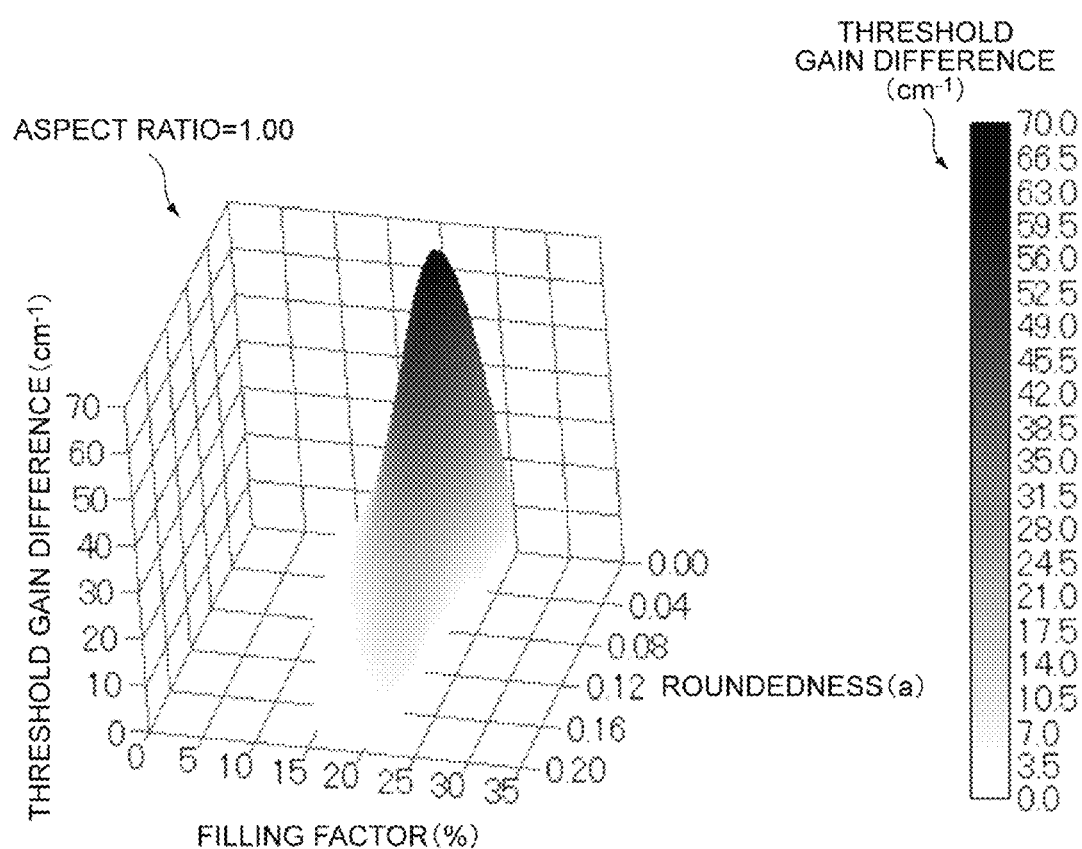
FIG. 26 is a drawing showing a correlation of threshold gain differences with values of the filling factor and values of the roundedness with the aspect ratio kept constant.
Figure 27:
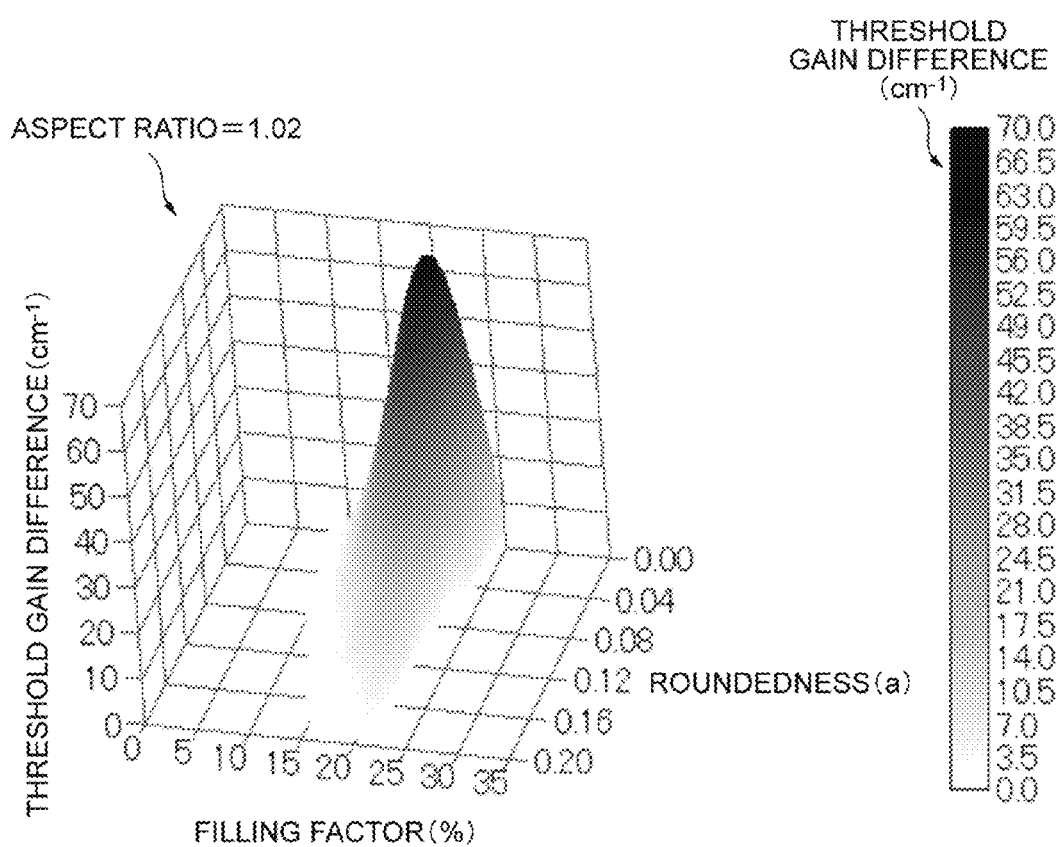
FIG. 27 is a drawing showing a correlation of threshold gain differences with values of the filling factor and values of the roundedness with the aspect ratio kept constant.
Figure 28:
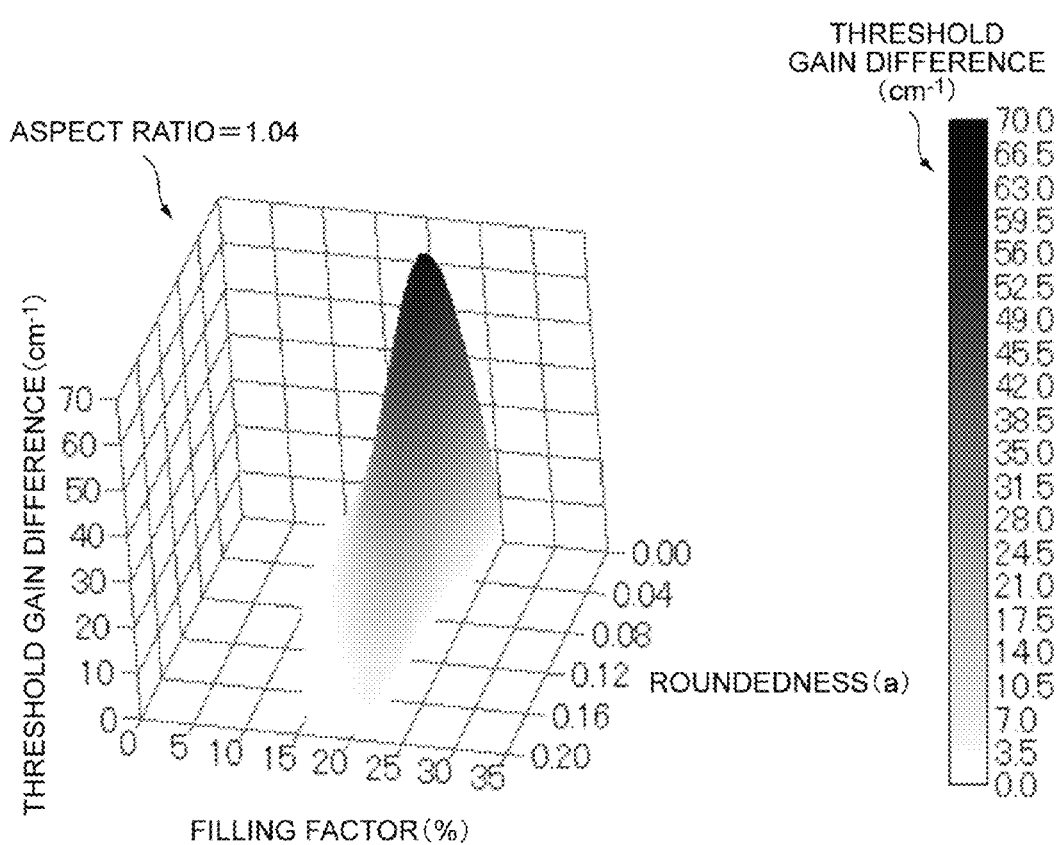
FIG. 28 is a drawing showing a correlation of threshold gain differences with values of the filling factor and values of the roundedness with the aspect ratio kept constant.
Figure 29:
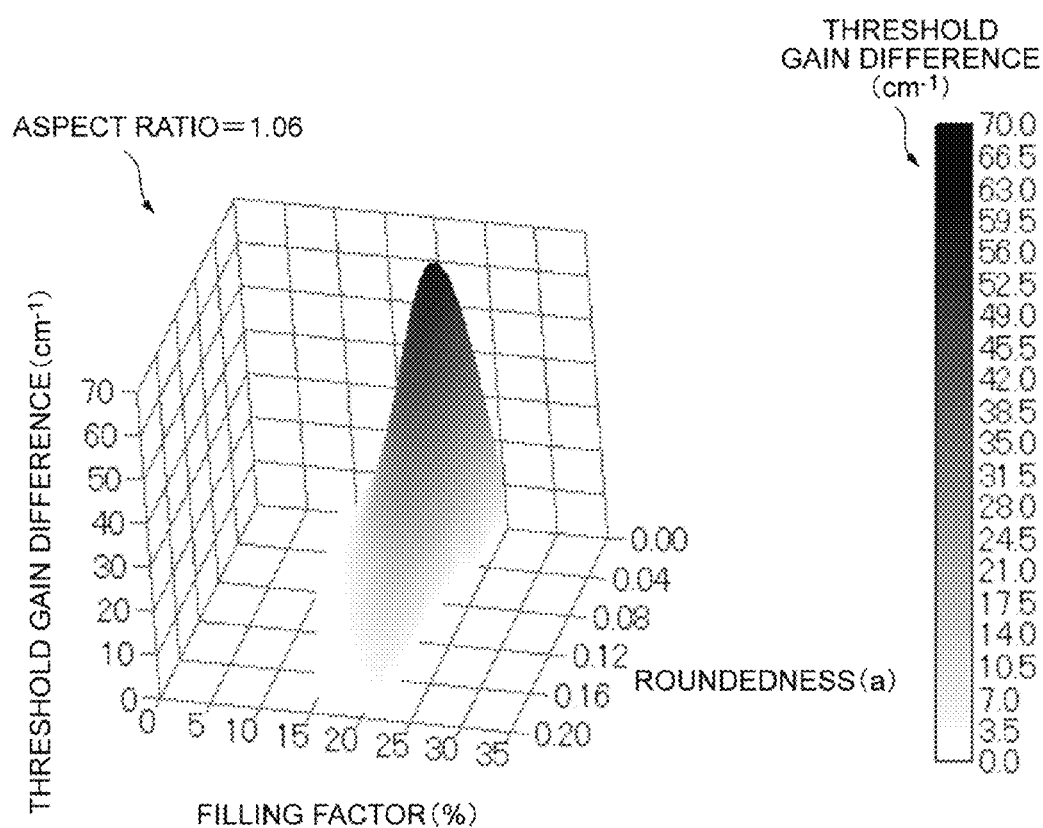
FIG. 29 is a drawing showing a correlation of threshold gain differences with values of the filling factor and values of the roundedness with the aspect ratio kept constant.
Figure 30:
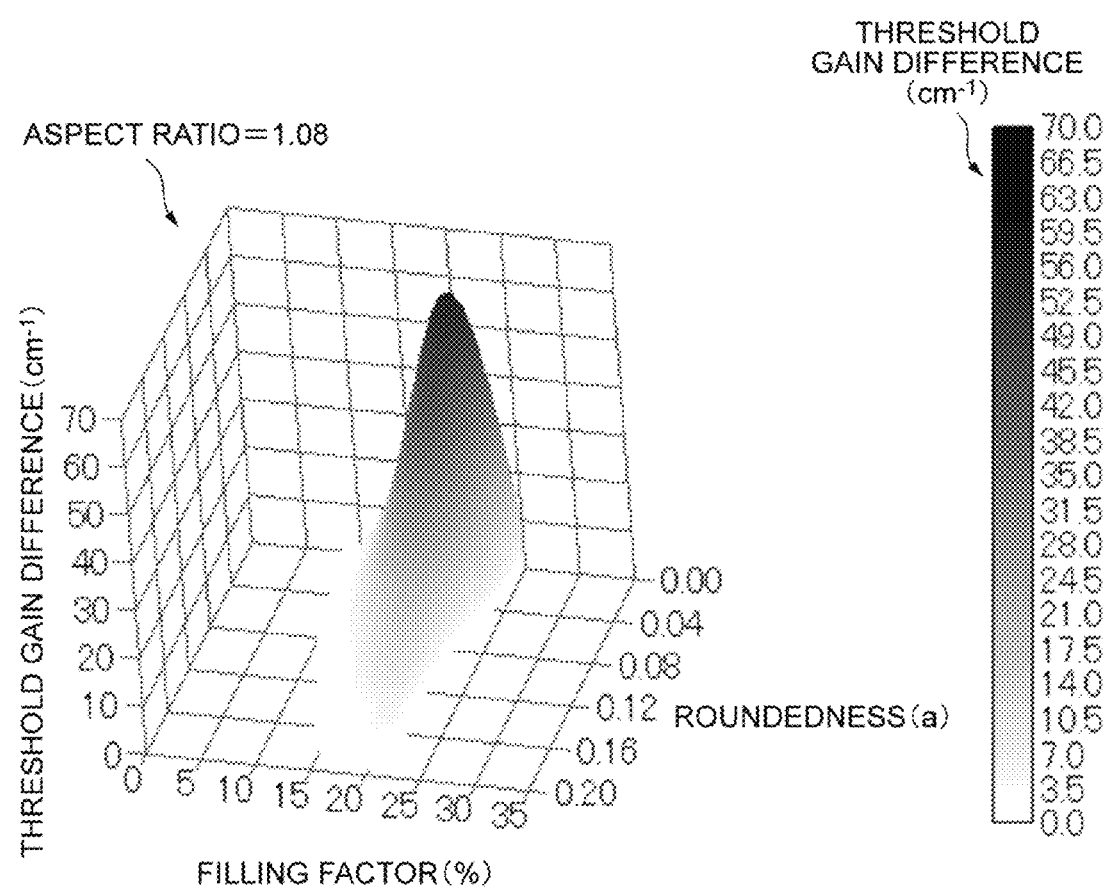
FIG. 30 is a drawing showing a correlation of threshold gain differences with values of the filling factor and values of the roundedness with the aspect ratio kept constant.
Figure 31:
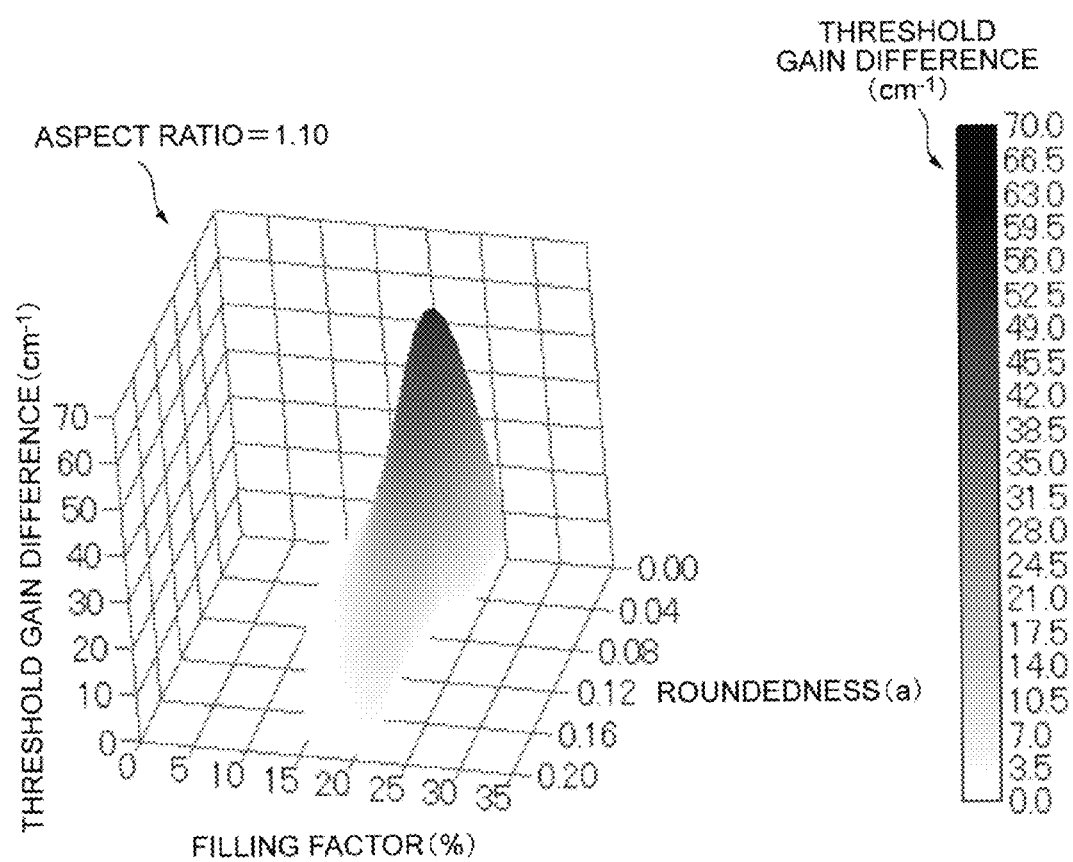
FIG. 31 is a drawing showing a correlation of threshold gain differences with values of the filling factor and values of the roundedness with the aspect ratio kept constant.
Figure 32:
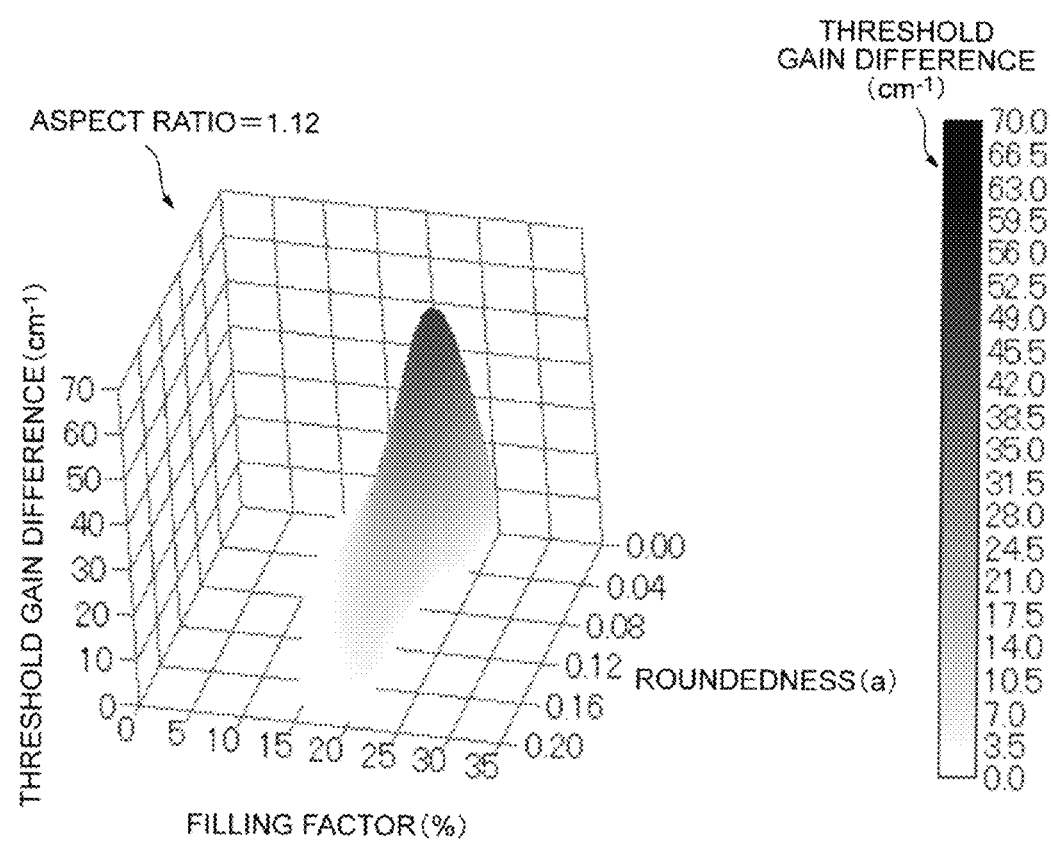
FIG. 32 is a drawing showing a con-elation of threshold gain differences with values of the filling factor and values of the roundedness with the aspect ratio kept constant.
Figure 33:
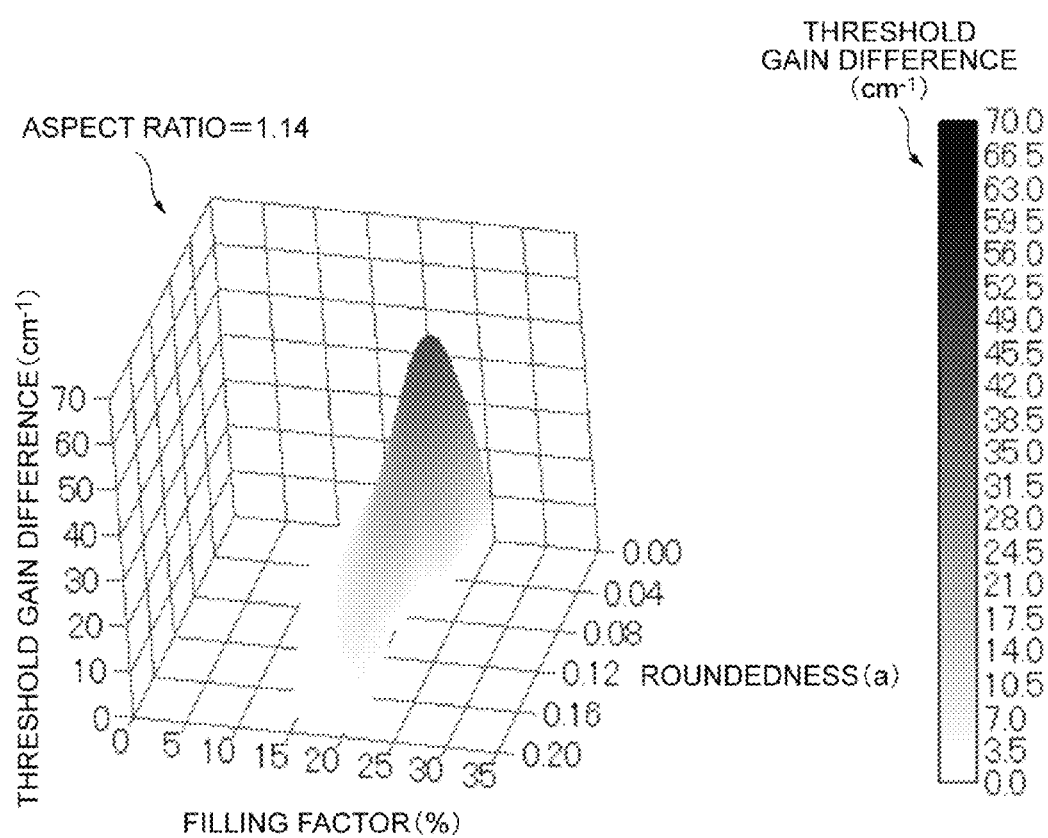
FIG. 33 is a drawing showing a correlation of threshold gain differences with values of the filling factor and values of the roundedness with the aspect ratio kept constant.
Figure 34:
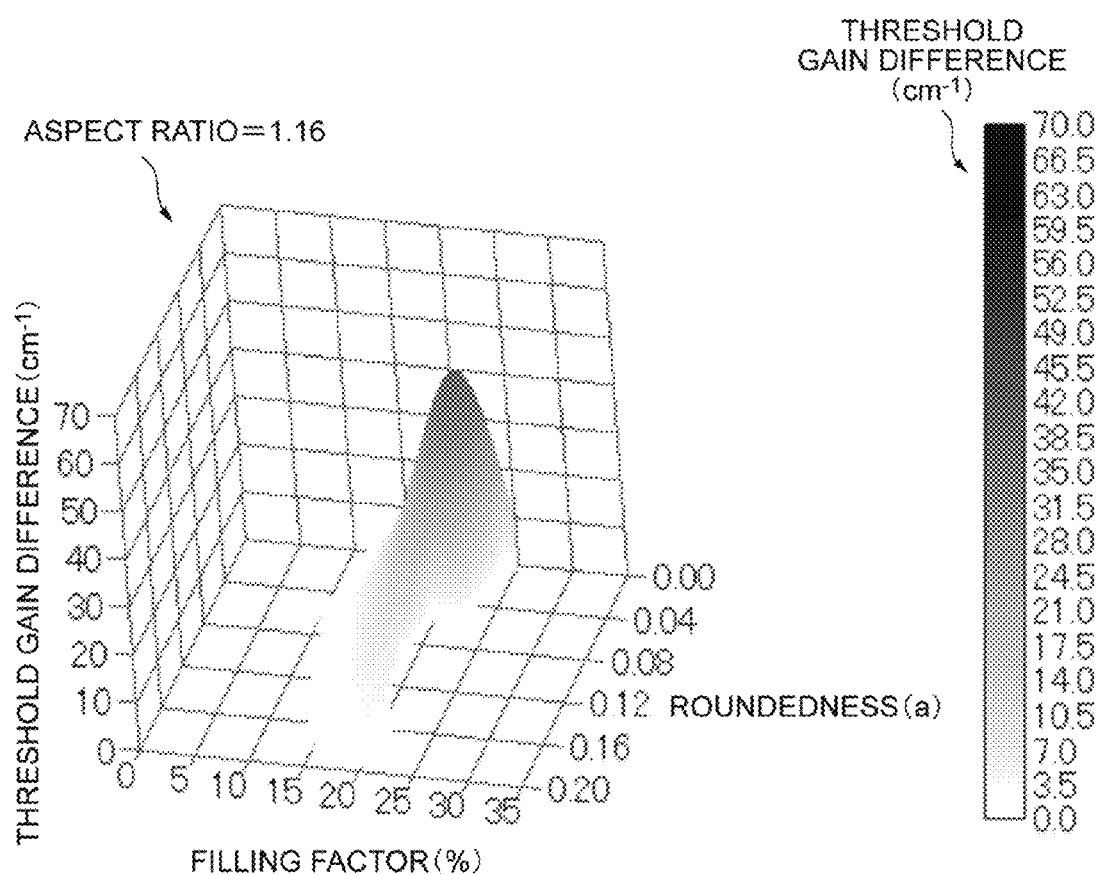
FIG. 34 is a drawing showing a correlation of threshold gain differences with values of the filling factor and values of the roundedness with the aspect ratio kept constant.
Figure 35:
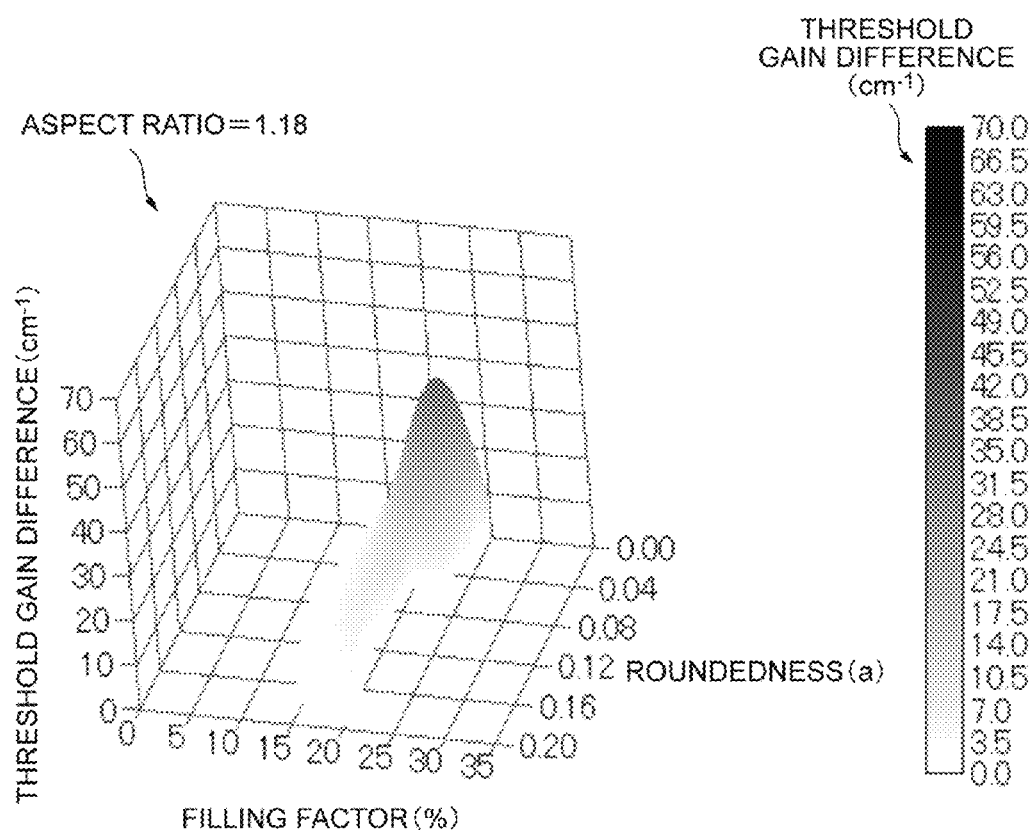
FIG. 35 is a drawing showing a correlation of threshold gain differences with values of the filling factor and values of the roundedness with the aspect ratio kept constant.
Figure 36:
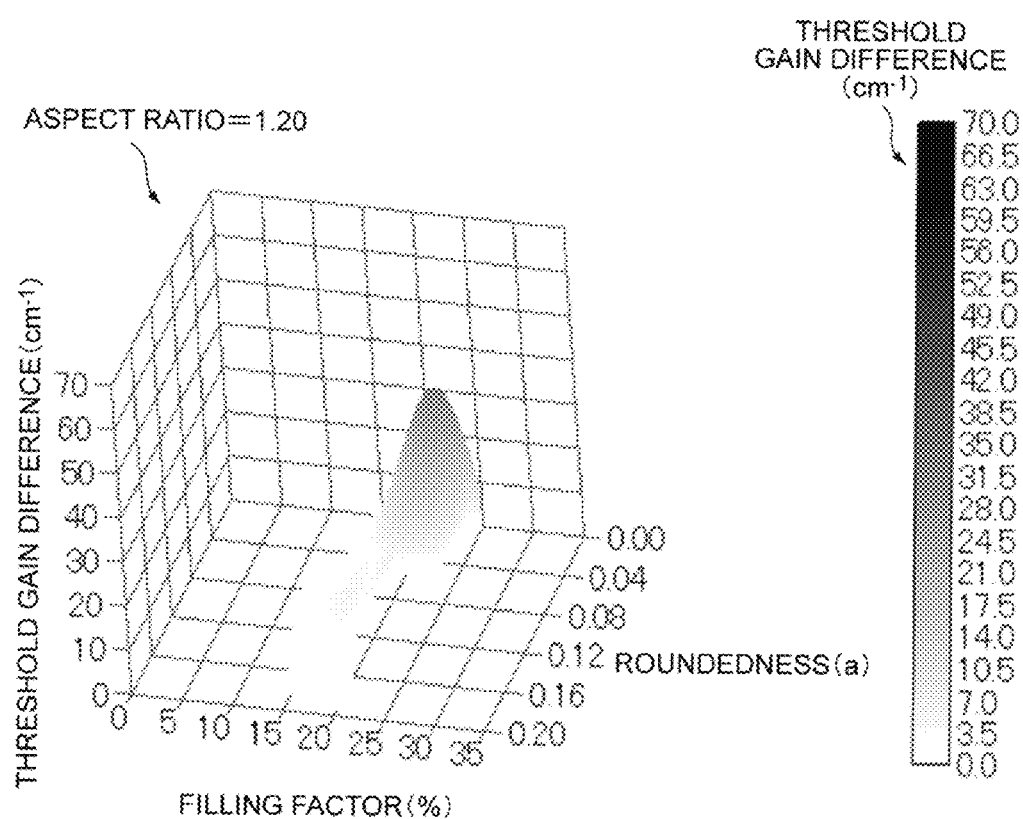
FIG. 36 is a drawing showing a correlation of threshold gain differences with values of the filling factor and values of the roundedness with the aspect ratio kept constant.
Figure 37:
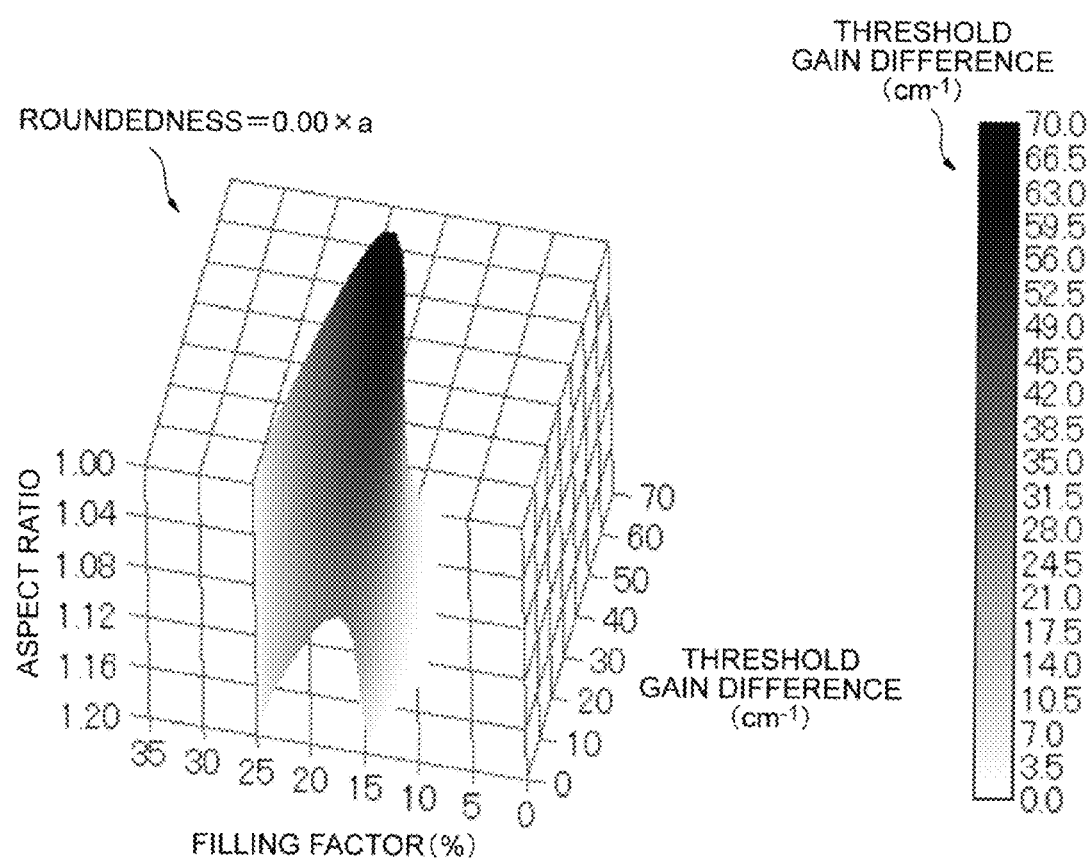
FIG. 37 is a drawing showing a correlation of threshold gain differences with values of the filling factor and values of the aspect ratio with the roundedness kept constant.
Figure 38:
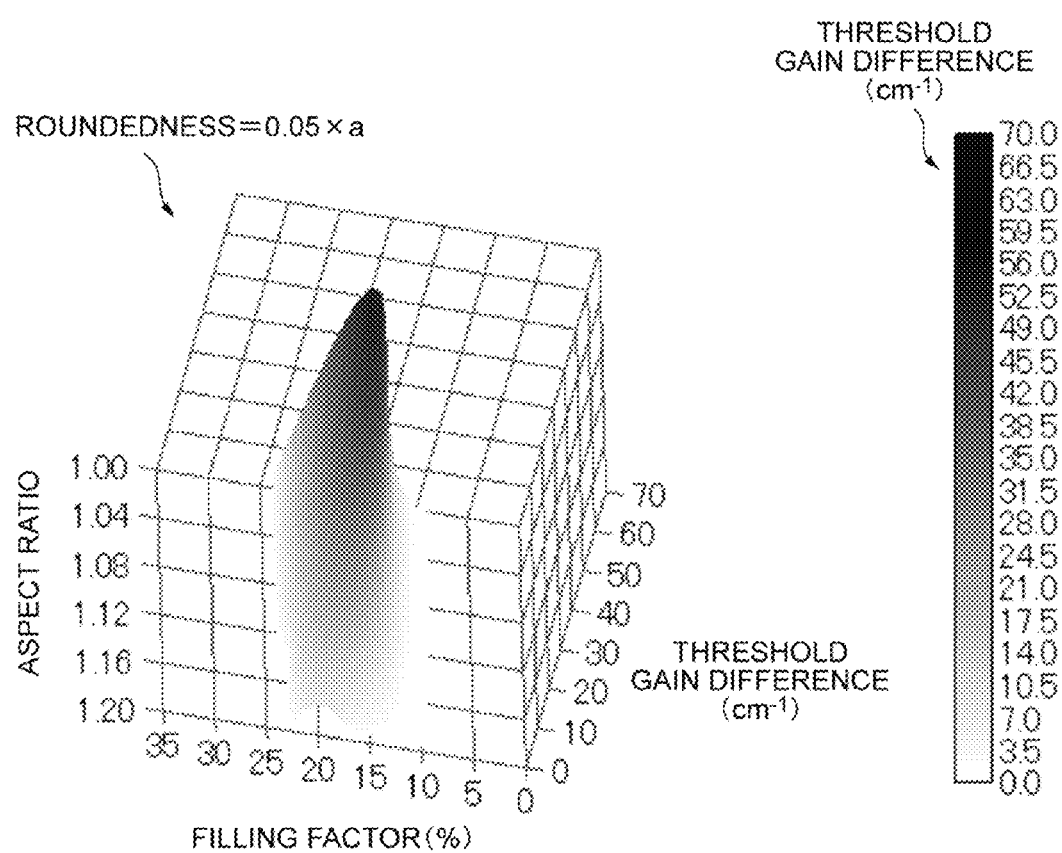
FIG. 38 is a drawing showing a correlation of threshold gain differences with values of the filling factor and values of the aspect ratio with the roundedness kept constant.
Figure 39:
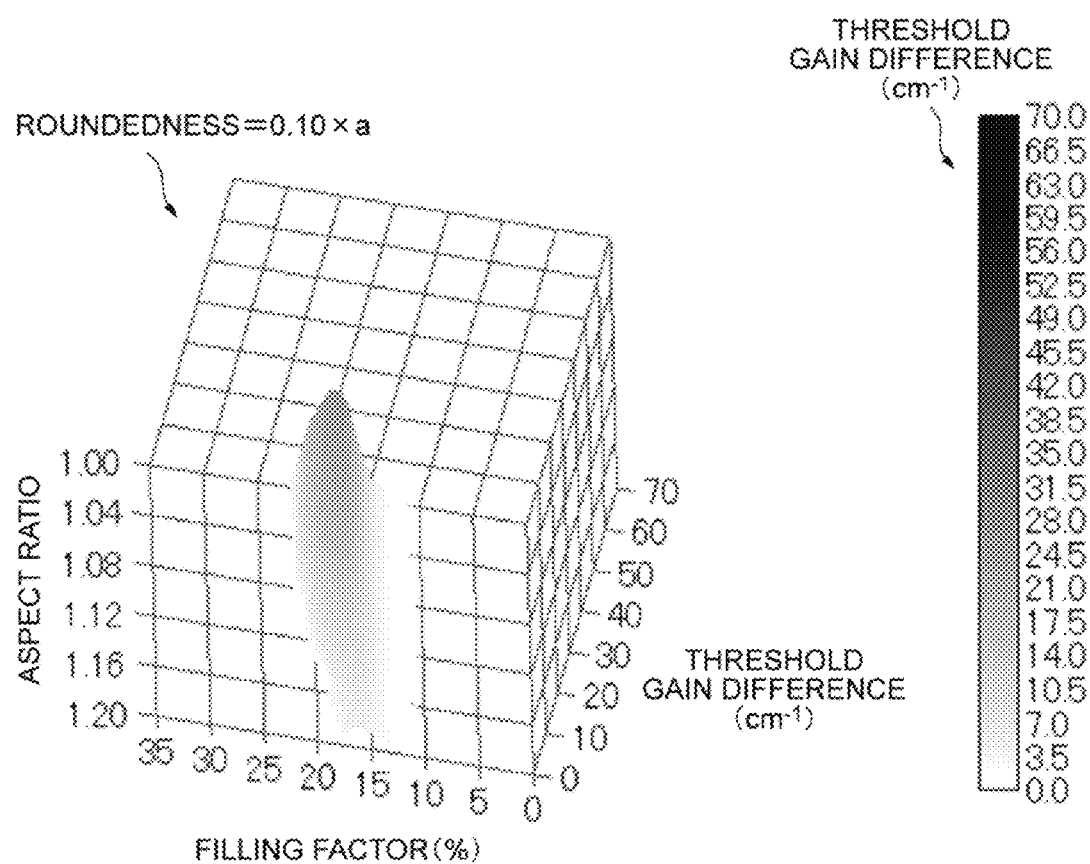
FIG. 39 is a drawing showing a correlation of threshold gain differences with values of the filling factor and values of the aspect ratio with the roundedness kept constant.
Figure 40:
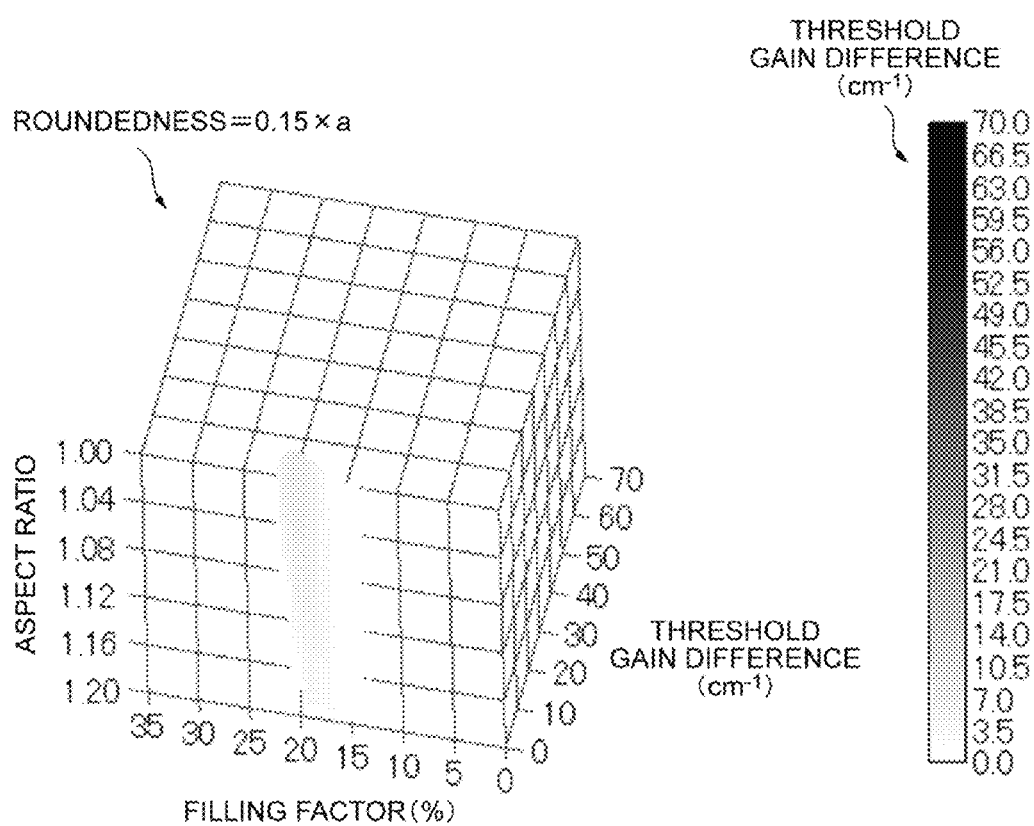
FIG. 40 is a drawing showing a correlation of threshold gain differences with values of the filling factor and values of the aspect ratio with the roundedness kept constant.
Figure 41:
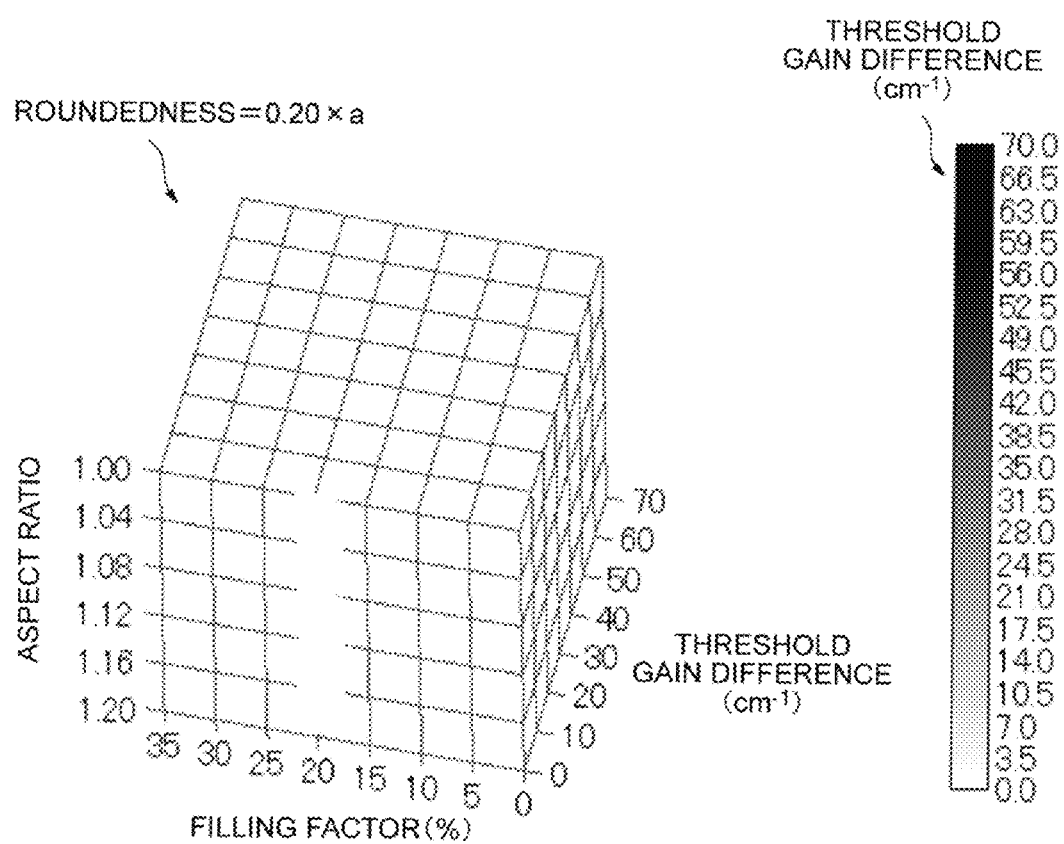
FIG. 41 is a drawing showing a correlation of threshold gain differences with values of the filling factor and values of the aspect ratio with the roundedness kept constant.

The simulation results shown in respective drawings of FIGS. 26 to 36 show correlations of threshold gain differences with values of the filling factor and values of the roundedness with the aspect ratio being kept constant, out of the three factors to define the shape of the unit lattice R3a (which are the roundedness, the filling factor, and the aspect ratio, while the angle Φ is zero degree). FIG. 26 shows the case of the aspect ratio=1.00, FIG. 27 the case of the aspect ratio=1.02, FIG. 28 the case of the aspect ratio=1.04, FIG. 29 the case of the aspect ratio=1.06, FIG. 30 the case of the aspect ratio=1.08, FIG. 31 the case of the aspect ratio=1.10, FIG. 32 the case of the aspect ratio=1.12, FIG. 33 the case of the aspect ratio=1.14, FIG. 34 the case of the aspect ratio=1.16, FIG. 35 the case of the aspect ratio=1.18, and FIG. 36 the case of the aspect ratio=1.20. The simulation results shown in respective drawings of FIGS. 37 to 41 show correlations of threshold gain differences with values of the filling factor and values of the aspect ratio with the roundedness being kept constant, out of the three factors to define the shape of the unit lattice R3a (which are the roundedness, the filling factor, and the aspect ratio, while the angle Φ is zero degree). FIG. 37 shows the case of the roundedness=0.00×a, FIG. 38 the case of the roundedness=0.05×a, FIG. 39 the case of the roundedness=0.10×a, FIG. 40 the case of the roundedness=0.15×a, and FIG. 41 the case of the roundedness=0.20×a.

The Inventor discovered in view of FIGS. 37 to 41 that the oscillation in Mode B became particularly prominent when the shape of the approximate right triangle of the bottom face 6c of the hole 6b satisfies any one of the following conditions (1) to (10):

(1) the roundedness (K1 which is the same for the description hereinafter) is 0.00×the lattice constant (the lattice constant might be represented by a in the above description, which is the same for the description hereinafter), the filling factor (K3 which is the same for the description hereinafter) is not less than 10% and not more than 25%, and the aspect ratio (K2 which is the same for the description hereinafter) is not less than 1.00 and not more than 1.16;

(2) the roundedness is 0.00×the lattice constant, the filling factor is not less than 15% and not more than 25%, and the aspect ratio is not less than 1.16 and not more than 1.20;

(3) the roundedness is 0.05×the lattice constant, the filling factor is not less than 9% and not more than 24%, and the aspect ratio is not less than 1.00 and not more than 1.20;

(4) the roundedness is 0.10×the lattice constant, the filling factor is not less than 10% and not more than 22%, and the aspect ratio is not less than 1.00 and not more than 1.08;

(5) the roundedness is 0.10×the lattice constant, the filling factor is not less than 10% and not more than 21%, and the aspect ratio is not less than 1.08 and not more than 1.12;

(6) the roundedness is 0.10×the lattice constant, the filling factor is not less than 10% and not more than 18%, and the aspect ratio is not less than 1.12 and not more than 1.20;

(7) the roundedness is 0.15×the lattice constant, the filling factor is not less than 11% and not more than 22%, and the aspect ratio is not less than 1.00 and not more than 1.08;

(8) the roundedness is 0.15×the lattice constant, the filling factor is not less than 11% and not more than 21%, and the aspect ratio is not less than 1.08 and not more than 1.16;

(9) the roundedness is 0.15×the lattice constant, the filling factor is not less than 11% and not more than 20%, and the aspect ratio is not less than 1.16 and not more than 1.20;

(10) the roundedness is 0.20×the lattice constant, the filling factor is not less than 13% and not more than 22%, and the aspect ratio is not less than 1.00 and not more than 1.20.

It is noted that the aspect ratios (K2) in the above conditions (1) to (10) can be either h/b or b/h of the hole 6b of the unit lattice R3a shown in FIG. 3 as long as it is common to all the unit lattices R3a of the diffraction grating 6ba.

The below will describe continuity between the discretely-obtained simulation results shown in FIGS. 24 to 41, from the physical viewpoint. The threshold gains of the simulation results shown in FIGS. 24 to 41 correspond to likeliness of leakage of light from the cavity composed of the p-type cladding layer 7, the diffraction grating layer 6 with the photonic crystal structure, the electron blocking layer 5, the active layer 4, and the n-type cladding layer 3. Namely, the threshold gain increases as light is more likely to leak. The simulations shown in FIGS. 24 to 41 are those obtained on the premise that the size of the photonic crystal structure of the diffraction grating layer 6 is infinite in the lateral directions (directions in which the photonic crystal structure of the diffraction grating layer 6 extends, or directions perpendicular to the direction of emission of the laser beam L1) and that there occurs no light leakage in the lateral directions. The factor to determine the magnitude of the threshold gain is only the light leakage in the direction perpendicular to the surface of the diffraction grating layer 6 (or in the direction perpendicular to the foregoing lateral directions), i.e., light leakage in the emission direction of the laser beam L1. The magnitude of the light leakage in the case where there is the light leakage in the emission direction of the laser beam L1 in this manner, varies depending upon symmetry of the electric field distribution in the photonic crystal plane. This electric field distribution differs mode by mode and varies with variation in shape of the hole. As apparent from the boundary conditions of the Maxwell's equations in general, the magnitude of the electric field crossing an interface between different refractive indices varies depending upon the refractive indices (cf. the description in Non Patent Literature 3). Since the electric field in the structure of the diffraction grating layer 6 used for the simulations of FIGS. 24 to 41 has the components in the directions parallel to the foregoing lateral directions, the symmetry of the electric field varies with variation in the shape of the unit lattice R3a (hole 6b) viewed from the direction perpendicular to the lateral directions (or from the emission direction of the laser beam L1). Incidentally, in the photonic crystal lasers including the semiconductor laser element 1 of the present embodiment, the resonant condition is formed in the photonic crystal plane and light diffracted into the direction perpendicular to the photonic crystal plane is utilized as output; therefore, destructive interference of light occurs depending upon the symmetry of the electric field in the photonic crystal plane, so as to change the magnitude of the output in the direction perpendicular to the photonic crystal plane. Therefore, with change in the shape of the unit lattice R3a (hole 6b) as described above, the symmetry of the electric field in the photonic crystal plane varies, the magnitude of the destructive interference of the light diffracted into the direction perpendicular to the photonic crystal plane varies, and the light leakage into the direction perpendicular to the photonic crystal plane varies; therefore, the threshold gain also varies according to this variation. Since the electric field distributions are different among the modes of Modes A to D, the magnitudes of the threshold gains are also different among the modes of Modes A to D. In the simulations of FIGS. 24 to 41 the discrete simulation results were obtained with discrete variation in the shape of the unit lattice R3a (hole 6b), and it can be contemplated from the above-described physical background that the discrete results of FIGS. 24 to 41 are continuously interpolated.

The principles of the present invention were illustrated and described above in the preferred embodiment but a person skilled in the art can recognize that the present invention can be modified in arrangement and details without departing from the principles. The present invention is by no means intended to be limited to the specific configurations disclosed in the embodiment. Therefore, the Inventor claims the right to all modifications and changes falling within the scope of claims and coming from the scope of the spirit thereof.

For example, in the case of the above embodiment, the diffraction grating layer 6 lies between the active layer 4 and the p-type cladding layer 7, but it may be provided between the active layer 4 and the n-type cladding layer 3. In the case of this arrangement, the electron blocking layer 5 also lies between the active layer 4 and the p-type cladding layer 7.

INDUSTRIAL APPLICABILITY

The present invention is applicable to the semiconductor laser elements required to have high beam quality (the index $M^2<1$).

REFERENCE SIGNS LIST

1 . . . semiconductor laser element; 10 . . . p-side electrode; 1a . . . semiconductor laminate; 1a1 . . . front surface; 1a2 . . . back surface; 1b1, 1b2 . . . laminates; 2 . . . support substrate; 20 . . . first epitaxial layer structure; 201 . . . surface; 20a . . . n-GaAs Substrate; 20b . . . n-AlGaAs Cladding layer; 20c . . . i-AlGaAs Guide layer; 20d . . . i-InGaAs/AlGaAs 3QWs; 20e . . . i-AlGaAs Carrier blocking layer; 20f . . . i-AlGaAs Guide layer; 20g . . . i-GaAs Guide layer; 20h . . . i-GaAs Guide layer; 20i . . . i-GaAs/AlGaAs PC layer; 21, 22 . . . resists; 22a . . . photonic crystal pattern; 23 . . . second epitaxial layer structure; 231 . . . third epitaxial layer structure; 23a . . . photonic crystal pattern; 23a1 . . . photonic crystal pattern; 24 . . . fourth epitaxial layer structure; 24a . . . p-AlGaAs Cladding layer; 24b . . . p-GaAs Contact layer; 25, 26 . . . SiN layers; 26a, 28a . . . openings; 27 . . . p-side electrode; 28 . . . SiN layer; 29 . . . n-side electrode; 2a . . . principal surface; 3 . . . n-type cladding layer; 4 . . . active layer; 5 . . . electron blocking layer; 6 . . . diffraction grating layer; 6a . . . p-side surface; 6b . . . holes; 6b1 . . . first side; 6b2 . . . second side; 6b3 . . . third side; 6b4, 6b5, 6b6 . . . vertices; 6ba . . . diffraction grating; 6c . . . bottom face; 7 . . . p-type cladding layer; 8 . . . contact layer; 9 . . . n-side electrode; a . . . lattice constant; b . . . side length; Ci . . . reference circle; D . . . converging radius; d . . . converging radius; h . . . side length; L1 . . . laser beam; L2 . . . lens; N1 . . . hatched portions; M1 . . . magnetic field distribution; R1 . . . direction; R10, R11, R12, R9 . . . magnetic field distributions; R13, R4 . . . beam waists; R13a1, R13b1, R14a, R14b, R19, R20, R21, R22 . . . marks (legends); R13a2, R13b2 . . . curves; R14, R15, R16, R17, R18 . . . measurement results; R2 . . . luminous region; R23 . . . peak; R25a, R25b, R25c, R25d . . . graphs; R3 . . . square lattice; R3a . . . unit lattice; R5, R6 . . . beam shapes; R7 . . . directions of electric fields; R8 . . . node of electromagnetic field; Ra . . . reference radius; S1, S10, S11, S2, S3, S4, S5, S6, S7, S8, S9 . . . steps; VX, VY . . . lattice vectors; W . . . beam radius; Θ, θ . . . beam divergence angles; Dr1, Dr2 . . . directions; Φ . . . angle.

The invention claimed is:

1. A semiconductor laser element comprising a semiconductor laminate,
wherein the semiconductor laminate comprises
a support substrate, a first cladding layer, an active layer, a diffraction grating layer, and a second cladding layer,
wherein the first cladding layer, the active layer, the diffraction grating layer, and the second cladding layer are provided on a principal surface of the support substrate,
wherein the active layer and the diffraction grating layer are provided between the first cladding layer and the second cladding layer,
wherein the active layer generates light,
wherein the second cladding layer has a conductivity type different from a conductivity type of the first cladding layer,
wherein the diffraction grating layer has a diffraction grating,
wherein the diffraction grating has a two-dimensional photonic crystal structure of square lattice arrangement,
wherein the two-dimensional photonic crystal structure has a plurality of holes and extends along the principal surface,
wherein the plurality of holes have an identical shape and are arranged along a square lattice of the diffraction grating,
wherein the hole corresponds to a lattice point of the diffraction grating,
wherein a shape of a bottom face of the hole is a right triangle,
wherein the hole has a refractive index different from a refractive index of a base material of the diffraction grating,
wherein a node of an electromagnetic field generated in the diffraction grating by luminescence of the active layer is located substantially at the same position as a centroid of the right triangle of the hole,
wherein an extremum of intensity of a magnetic field in the electromagnetic field is present around the hole,
wherein the right triangle of the bottom face has a first side and second side,
wherein the first side and the second side make a right angle,
wherein each of three vertices of the right triangle of the bottom face is rounded so as to overlap circumference of reference circles touching the sides internally at the vertex,
wherein the shape of the right triangle of the hole satisfies any one of the following condition (1) to (9):
(1) a roundedness is 0.00×a lattice constant, a filling factor is not less than 15% and not more than 25%, and an aspect ratio is not less than 1.16 and not more than 1.20;

(2) a roundedness is 0.05×a lattice constant, a filling factor is not less than 9% and not more than 24%, and an aspect ratio is not less than 1.00 and not more than 1.20;

(3) a roundedness is 0.10×a lattice constant, a filling factor is not less than 10% and not more than 22%, and an aspect ratio is not less than 1.00 and not more than 1.08;

(4) a roundedness is 0.10×a lattice constant, a filling factor is not less than 10% and not more than 21%, and an aspect ratio is not less than 1.08 and not more than 1.12;

(5) a roundedness is 0.10×a lattice constant, a filling factor is not less than 10% and not more than 18%, and an aspect ratio is not less than 1.12 and not more than 1.20;

(6) a roundedness is 0.15×a lattice constant, a filling factor is not less than 11% and not more than 22%, and an aspect ratio is not less than 1.00 and not more than 1.08;

(7) a roundedness is 0.15×a lattice constant, a filling factor is not less than 11% and not more than 21%, and an aspect ratio is not less than 1.08 and not more than 1.16;

(8) a roundedness is 0.15×a lattice constant, a filling factor is not less than 11% and not more than 20%, and an aspect ratio is not less than 1.16 and not more than 1.20;

(9) a roundedness is 0.20×a lattice constant, a filling factor is not less than 13% and not more than 22%, and an aspect ratio is not less than 1.00 and not more than 1.20;

wherein the roundedness is a radius of the reference circle, wherein the lattice constant is a length of one side of a unit cell of the diffraction grating, wherein the filling factor is a rate of an area of a unit cell, and wherein the aspect ratio is a ratio of a side length of the first side and a side length of the second side on the assumption that the vertices are not rounded.

2. The semiconductor laser element according to claim 1, wherein the semiconductor laminate further comprises an electron blocking layer, and wherein the electron blocking layer lies between one of the cladding layers which have a conductivity type of p-type, and the active layer.

3. The semiconductor laser element according to claim 1, wherein the diffraction grating layer lies between one of the cladding layers which have a conductive type of p-type, and the active layer.

4. The semiconductor laser element according to claim 1, wherein a material of the semiconductor laminate is a III-V semiconductor containing GaAs.

5. The semiconductor laser element according to claim 1, wherein the first side is inclined relative to a lattice vector of a square lattice.

* * * * *